United States Patent
Eroz et al.

(10) Patent No.: US 8,095,854 B2
(45) Date of Patent: Jan. 10, 2012

(54) METHOD AND SYSTEM FOR GENERATING LOW DENSITY PARITY CHECK CODES

(75) Inventors: Mustafa Eroz, Germantown, MD (US); Feng-Wen Sun, Germantown, MD (US); Lin-Nan Lee, Potomac, MD (US)

(73) Assignee: DTVG Licensing, Inc., El Segundo, CA (US)

( * ) Notice: Subject to any disclaimer, the term of this patent is extended or adjusted under 35 U.S.C. 154(b) by 1077 days.

(21) Appl. No.: 11/938,016

(22) Filed: Nov. 9, 2007

(65) Prior Publication Data

US 2008/0082895 A1  Apr. 3, 2008

Related U.S. Application Data

(62) Division of application No. 10/353,230, filed on Jan. 28, 2003.

(60) Provisional application No. 60/398,760, filed on Jul. 26, 2002, provisional application No. 60/403,812, filed on Aug. 15, 2002, provisional application No. 60/421,505, filed on Oct. 25, 2002, provisional application No. 60/421,999, filed on Oct. 29, 2002, provisional application No. 60/423,710, filed on Nov. 4, 2002.

(51) Int. Cl.
  *H03M 13/00* (2006.01)
(52) U.S. Cl. ........................................ 714/774; 714/758
(58) Field of Classification Search .................. 714/774, 714/758
See application file for complete search history.

(56) References Cited

U.S. PATENT DOCUMENTS

| | | | | |
|---|---|---|---|---|
| 4,709,377 | A * | 11/1987 | Martinez et al. | 375/265 |
| 5,099,484 | A | 3/1992 | Smelser | |
| 5,371,471 | A * | 12/1994 | Chennakeshu et al. | 329/304 |
| 5,467,132 | A * | 11/1995 | Fazel et al. | 375/240.01 |
| 5,559,990 | A | 9/1996 | Cheng et al. | |
| 5,949,796 | A * | 9/1999 | Kumar | 370/529 |
| 6,031,874 | A * | 2/2000 | Chennakeshu et al. | 375/262 |
| 6,075,408 | A | 6/2000 | Kullstam et al. | |
| 6,097,703 | A | 8/2000 | Larsen et al. | |
| 6,115,427 | A * | 9/2000 | Calderbank et al. | 375/267 |
| 6,216,200 | B1 | 4/2001 | Yeager | |
| 6,292,917 | B1 * | 9/2001 | Sinha et al. | 714/752 |
| 6,405,338 | B1 * | 6/2002 | Sinha et al. | 714/752 |
| 6,438,180 | B1 * | 8/2002 | Kavcic et al. | 375/341 |

(Continued)

FOREIGN PATENT DOCUMENTS

CA   2310186   12/2001

(Continued)

OTHER PUBLICATIONS

Canadian Office action dated May 7, 2010 in Canadian Patent Application No. 2456485 filed Jul. 3, 2003 by Mustafa Eroz et al.

(Continued)

*Primary Examiner* — Joseph D Torres

(57) ABSTRACT

An approach for generating a structured Low Density Parity Check (LDPC) codes is provided. Structure of the LDPC codes is provided by restricting a certain part of the parity check matrix to be lower triangular, hence enabling a very simple encoding method that does not require the generator matrix of the code. The approach can also exploit the unequal error protecting capability of LDPC codes on transmitted bits to provide extra error protection to more vulnerable bits of high order modulation constellations (such as 8-PSK (Phase Shift Keying)).

7 Claims, 15 Drawing Sheets

U.S. PATENT DOCUMENTS

| | | | |
|---|---|---|---|
| 6,510,536 B1* | 1/2003 | Crozier et al. | 714/755 |
| 6,518,892 B2* | 2/2003 | Shen et al. | 341/50 |
| 6,539,367 B1* | 3/2003 | Blanksby et al. | 706/14 |
| 6,553,535 B1 | 4/2003 | Asada et al. | |
| 6,567,465 B2 | 5/2003 | Goldstein et al. | |
| 6,633,856 B2 | 10/2003 | Richardson et al. | |
| 6,665,361 B1 | 12/2003 | Christodoulides et al. | |
| 6,715,121 B1 | 3/2004 | Laurent | |
| 6,718,508 B2 | 4/2004 | Lodge et al. | |
| 6,751,770 B2* | 6/2004 | Morelos-Zaragoza | 714/781 |
| 6,769,091 B2* | 7/2004 | Classon et al. | 714/792 |
| 6,785,863 B2* | 8/2004 | Blankenship et al. | 714/799 |
| 6,789,227 B2 | 9/2004 | De Souza et al. | |
| 6,829,308 B2* | 12/2004 | Eroz et al. | 375/271 |
| 6,857,097 B2* | 2/2005 | Yedidia et al. | 714/752 |
| 6,895,547 B2* | 5/2005 | Eleftheriou et al. | 714/801 |
| 6,901,119 B2* | 5/2005 | Cideciyan et al. | 375/341 |
| 6,938,196 B2* | 8/2005 | Richardson et al. | 714/752 |
| 6,950,461 B2 | 9/2005 | Goldstein et al. | |
| 6,963,622 B2 | 11/2005 | Eroz et al. | |
| 6,965,652 B1 | 11/2005 | Burd et al. | |
| 6,985,536 B2* | 1/2006 | Oelcer et al. | 375/261 |
| 7,000,177 B1* | 2/2006 | Wu et al. | 714/801 |
| 7,017,106 B2* | 3/2006 | Shen et al. | 714/801 |
| 7,072,417 B1 | 7/2006 | Burd et al. | |
| 7,116,710 B1 | 10/2006 | Jin et al. | |
| 7,165,205 B2 | 1/2007 | Blankenship et al. | |
| 7,178,082 B2 | 2/2007 | Yu et al. | |
| 7,184,486 B1* | 2/2007 | Wu et al. | 375/262 |
| 7,191,378 B2 | 3/2007 | Eroz et al. | |
| 7,421,644 B2 | 9/2008 | Mantha et al. | |
| 7,620,880 B2 | 11/2009 | Niu et al. | |
| 2002/0002695 A1 | 1/2002 | Kschischang et al. | |
| 2002/0021770 A1* | 2/2002 | Beerel et al. | 375/340 |
| 2002/0042899 A1 | 4/2002 | Tzannes et al. | |
| 2002/0048329 A1* | 4/2002 | Tran et al. | 375/340 |
| 2002/0051499 A1* | 5/2002 | Cameron et al. | 375/295 |
| 2002/0051501 A1 | 5/2002 | Demjanenko et al. | |
| 2002/0071504 A1* | 6/2002 | Chen et al. | 375/341 |
| 2002/0136318 A1* | 9/2002 | Gorokhov et al. | 375/261 |
| 2002/0141507 A1 | 10/2002 | Morgan et al. | |
| 2002/0150167 A1 | 10/2002 | Demjanenko et al. | |
| 2002/0153938 A1 | 10/2002 | Baudelot et al. | |
| 2002/0188906 A1 | 12/2002 | Kurtas et al. | |
| 2003/0014718 A1 | 1/2003 | De Souza et al. | |
| 2003/0023917 A1 | 1/2003 | Richardson et al. | |
| 2003/0033570 A1 | 2/2003 | Khannanov et al. | |
| 2003/0033575 A1 | 2/2003 | Richardson et al. | |
| 2003/0037298 A1* | 2/2003 | Eleftheriou et al. | 714/752 |
| 2003/0058958 A1 | 3/2003 | Shokrollahi et al. | |
| 2003/0065989 A1 | 4/2003 | Yedida et al. | |
| 2003/0074626 A1 | 4/2003 | Coker et al. | |
| 2003/0079171 A1 | 4/2003 | Coe et al. | |
| 2003/0079172 A1 | 4/2003 | Yamagishi et al. | |
| 2003/0081691 A1 | 5/2003 | Sutskover et al. | |
| 2003/0091098 A1 | 5/2003 | Manninen et al. | |
| 2003/0104788 A1 | 6/2003 | Kim | |
| 2003/0126551 A1 | 7/2003 | Mantha et al. | |
| 2003/0187899 A1 | 10/2003 | Ohta | |
| 2003/0203721 A1 | 10/2003 | Berezdivin et al. | |
| 2003/0207696 A1 | 11/2003 | Willeneger et al. | |
| 2004/0034827 A1 | 2/2004 | Shen et al. | |
| 2004/0034828 A1 | 2/2004 | Hocevar | |
| 2004/0064779 A1 | 4/2004 | Vasic et al. | |
| 2004/0093554 A1 | 5/2004 | Hung | |
| 2004/0098659 A1 | 5/2004 | Bjerke et al. | |
| 2004/0196861 A1 | 10/2004 | Rinchiuso et al. | |
| 2004/0221223 A1 | 11/2004 | Yu et al. | |
| 2005/0005231 A1 | 1/2005 | Sun et al. | |
| 2005/0063484 A1 | 3/2005 | Eroz et al. | |
| 2005/0149841 A1 | 7/2005 | Kyung et al. | |
| 2005/0154958 A1 | 7/2005 | Xia et al. | |
| 2005/0235195 A1 | 10/2005 | Choi et al. | |
| 2005/0257124 A1 | 11/2005 | Richardson et al. | |
| 2005/0265387 A1 | 12/2005 | Khojastepour et al. | |
| 2005/0278606 A1 | 12/2005 | Richardson et al. | |
| 2006/0156181 A1 | 7/2006 | Ha et al. | |
| 2008/0282127 A1 | 11/2008 | Mantha et al. | |

FOREIGN PATENT DOCUMENTS

| | | |
|---|---|---|
| EP | 1093231 A1 | 4/2001 |
| JP | 2002-94450 | 3/2002 |
| WO | WO 02/056559 | 7/2002 |
| WO | WO 02/099976 | 12/2002 |
| WO | WO 02/103631 | 12/2002 |
| WO | 03/001726 | 1/2003 |
| WO | WO 03/065591 | 8/2003 |
| WO | WO 03/088504 | 10/2003 |
| WO | 2004019268 A | 3/2004 |
| WO | 2004/077733 | 9/2004 |

OTHER PUBLICATIONS

European Search Report dated May 10, 2010 in European divisional Patent Application No. 10001217.8 filed Jul. 3, 2003 (parent filing date of European Patent Application No. 03763495.3) by Mustafa Eroz et al.

Bond, J.W.; Hui, S.; Schmidt, H.; "Constructing Low-Density Parity-Check Codes"; EuroComm 2000; Information Systems for Enhanced Public Safety and Security; IEEE/AFCEA; May 17, 2000; Piscataway, New Jersey, USA; IEEE LNKD- DOI:10.1109/EURCOM.2000.874812; Jan. 1, 2000; pp. 260-262; XP010515080; ISBN: 978-0-7803-6323-6.

Bond, J.W.; Hui, S.; Schmidt, H.; "Constructing Low-Density Parity-Check Codes with Circulant Matrices"; Information Theory and Networking Workshop; 1999; Metsovo, Greece; Jun. 27-Jul. 1, 1999; p. 52; XP010365561; ISBN:978-0-7803-5954-3.

Yi, Yu; Hou, Jia; Lee, Moon Ho; "Design of Semi-Algebraic Low-Density Parity-Check (SA-LDPC) Codes for Multilevel Coded Modulation"; Proceedings, IEEE International Conference on Parallel and Distributed Computing, Applications and Technologies; PDCAT 2003; Aug. 27, 2003; pp. 931-934; XP010661473; ISBN: 978-0-7803-7840-7.

Vasic, Bane; Djordjevic, Ivan B.; "Low-Density Parity Check Codes for Long-Haul Optical Communication Systems"; IEEE Photonics Technology Letters; IEEE Photonics Technology Letters; IEEE Service Center; Piscataway, New Jersey, USA; vol. 14, No. 8; Aug. 1, 2002; XP011067271; ISSN:1041-1135.

Johnson, Sarah J.; Weller, Steven R.; "A Family of Irregular LDPC Codes with Low Encoding Complexity"; IEEE Communications Letters; IEEE Service Center; Piscataway, New Jersey, USA; vol. 7, No. 2; Feb. 1, 2003; XP011066488; ISSN:1089-7798.

Final Rejection dated Feb. 25, 2010 in U.S. Appl. No. 10/961,124, filed Oct. 8, 2004 by Mustafa Eroz et al.

EPO Summons to attend oral proceedings dated Mar. 11, 2010 in European Patent Application No. 03763216.3 filed Jul. 3, 2003 by Mustafa Eroz et al.

Non-final Office Action dated May 30, 2009 in U.S. Appl. No. 11/201,796, filed Aug. 11, 2005 by Mustafa Eroz et al.

Japanese Office Action dated Jul. 12, 2005 in Japanese counterpart Application No. 2003-176330 corresponding to U.S. Appl. No. 10/353,230, filed Jan. 28, 2003 by Mustafa Eroz et al.

Japanese Decision of Rejection dated Jun. 20, 2006 in Japanese counterpart Application No. 2003-176330 corresponding to U.S. Appl. No. 10/353,230, filed Jan. 28, 2003 by Mustafa Eroz et al.

Japanese Pre-Appeal Examination Report dated Dec. 25, 2006 in Japanese counterpart Application No. 2003-176330 corresponding to U.S. Appl. No. 10/353,230, filed Jan. 28, 2003 by Mustafa Eroz et al.

Final Rejection dated Oct. 28, 2008 in U.S. Appl. No. 10/961,124, filed Oct. 8, 2004 by Mustafa Eroz et al.

Canadian Office action dated Jan. 22, 2010 in Canadian Patent Application No. 2457420 filed Jul. 3, 2003 by Mustafa Eroz et al.; 3 pages.

Tullberg, H.M.; Siegel, P.H.; "Bit-Interleaved Coded Modulation for Delay-Constrained Mobile Communication Channels"; Proceedings, IEEE Vehicular Technology Conference; VTC 2000; Tokyo, Japan; IEEE, Inc.; New York, US; vol. 3 of 3; Conf. 51; May 15-18, 2000; pp. 2212-2216; XP000968397.

Non-final Office Action dated Aug. 13, 2008 in U.S. Appl. No. 11/201,796, filed Aug. 10, 2005 by Mustafa Eroz et al.

Final Rejection dated Dec. 31, 2008 in U.S. Appl. No. 11/201,796, filed Aug. 10, 2005 by Mustafa Eroz et al.

ESTI; "Digital Video Broadcasting (DVB); Second Generation Framing Structure, Channel Coding and Modulation Systems for Broadcasting, Interactive Services, News Gathering and Other Broadband Satellite Applications"; ETSI Drafts, LIS; Jun. 1, 2004; XP002325753; ISSN: 0000-0002; pp. 21-23.

Lu, Ben; Yue, Guosen; Wang, Xiaodong; "Performance Analysis and Design Optimization of LDPC-Coded MIMO OFDM Systems"; IEEE Transactions on Signal Processing, IEEE Service Center; New York, New York, USA; vol. 52, No. 2; Feb. 1, 2004; pp. 348-361; XP011105722; ISSN: 1053-587X.

Lee, Heung-No; "LDPC Coded Modulation MIMO OFDM Transceiver: Performance Comparison with Map Equalization"; Proceedings, IEEE Vehicular Technology Conference, VTC, 2003-Spring; Jeju, Korea; vol. 2; Apr. 22-25, 2003; pp. 1178-1182; XP010862634; ISBN: 978-0-7803-7757-8.

Supplemental European Search Report dated Apr. 1, 2009 in European patent Application No. 05789316.6 filed Aug. 3, 2005 by Mustafa Eroz et al.

Non-final Office Action dated Apr. 3, 2009 in U.S. Appl. No. 10/961,124, filed Oct. 8, 2004 by Mustafa Eroz et al.

Non-final Office Action dated Jun. 11, 2008 in U.S. Appl. No. 10/961,124, filed Oct. 8, 2004 by Mustafa Eroz et al.

Final Rejection dated Feb. 27, 2009 in U.S. Appl. No. 10/353,230, filed Jan. 28, 2003 by Mustafa Eroz et al.

Non-final Office Action dated Sep. 23, 2008 in U.S. Appl. No. 11/186,265, filed Jul. 21, 2005 by Mustafa Eroz et al.

Japanese Appeal Decision of Rejection dated Sep. 28, 2009 in Japanese Patent Application No. 2004-562643 filed Jul. 3, 2003 by Mustafa Eroz et al.; 9 pages.

EPO Summons to attend oral proceedings dated Nov. 17, 2009 in European Patent Application No. 03254214.4 filed Jul. 2, 2003 by Mustafa Eroz et al.; 14 pages.

Hou, Jilei; Siegel, Paul H.; Milstein, Laurence B.; Pfister, Henry D.; "Design of Low-Density Parity-Check Codes for Bandwidth Efficient Modulation"; Proceedings of the 2001 IEEE Information Theory Workshop; Cairns, Australia; Sep. 2-7, 2001; pp. 24-26.

Douillard, Catherine; Jezequel, Michel; Berrou, Claude; "Iterative Correction of Intersymbol Interference: Turbo-Equalization"; European Transactions on Telecommunications and related Technologies, AEI; Milano, Italy; vol. 6, No. 5; Sep.-Oct. 1995; pp. 507-511.

Li, Xiaodong; Ritcey, James A.; "Bit-Interleaved Coded Modulation with Iterative Decoding"; 1999 IEEE International Conference on Communications; ICC 1999; pp. 858-863.

EPO Summons to attend oral proceedings dated Mar. 5, 2010 in European Patent Application No. 05789316.6 filed Aug. 3, 2005 by Mustafa Eroz et al.

Non-final Office Action dated Sep. 30, 2009 in U.S. Appl. No. 10/961,124, filed Oct. 8, 2004 by Mustafa Eroz et al.

Chinese Office Action dated Sep. 19, 2008 in Chinese Patent Application No. 03132884.9 filed Jul. 24, 2003 by Mustafa Eroz et al.

Summons to Oral Proceedings dated Oct. 13, 2009 in European Patent Application No. 03763495.3 filed Jul. 3, 2003 by Mustafa Eroz et al.

Howland, C. and Blanksby, A.; "Parallel Decoding Architectures for Low Density Parity Check Codes"; 2001 IEEE International Symposium on Circuits and Systems (ISCAS 2001); vol. 4; pp. IV-742-IV-745.

Echard, Rich et al.; "The π-Rotation Low-Density Parity Check Codes"; 2001 IEEE; XP-001099251.

Mansour et al.; "Low-Power VLSI Decoder Architectures for LDPC Codes", Proceedings, IEEE International Symposium on Lower Power Electronics and Design; ISLPED '02; pp. 284-289; Aug. 12-14, 2002.

Al-Rawi, G. et al.; "Optimizing the Mapping of Low-Density Parity Check Codes on Parallel Decoding Architectures"; Proceedings, IEEE Conference on Information Technology: Coding and Computing; pp. 578-586; Apr. 2-4, 2001.

Selvarathinam, A. et al.; "A Massively Scaleable Decoder Architecture for Low-Density Parity-Check Codes"; Proceedings, IEEE International Symposium on Circuits and Systems; vol. 2; pp. 61-64; May 25-28, 2003.

Le Goff, S.Y.; "Channel Capacity of Bit-Interleaved Coded Modulation Schemes Using 8-ary Signal Constellations"; Electronics Letters; Feb. 14, 2002; vol. 28, No. 4.

Gallagher, R.G.; "Low-Density Parity Check Codes"; IRE Transactions of Information Theory; 1962; pp. 21-28; XP-000992693.

Futaki, Hisashi et al.; "Performance of Low-Density Parity-Check (LDPC) Coded OFDM Systems"; Tokyo University of Science, Faculty of Science and Technology; Japan; 2000 IEEE; pp. 1696-1700.

Mackay, David J.C.; "Good Error-Correcting Codes Based on Very Sparse Matrices"; IEEE Transaction on Information Theory; vol. 45, No. 2; Mar. 1999; pp. 399-431; XP-002143042.

Boutros, J. et al.; "Generalized Low Density (Tanner) Codes"; 1999 IEEE International Conference on Communications; vol. 1; Jun. 6-10, 1999; pp. 441-445.

Engling, Yeo et al.; "VLSI Architectures for Iterative Decoders in Magnetic Recording Channels"; IEEE Transactions on Magnetics; vol. 37, Issue 2; Mar. 2001; pp. 748-755.

Chen et al.; "High Throughput Overlapped Message Passing for Low Density Parity Check Codes"; GLSVLSI '03; Apr. 28-29, 2003.

Sipser et al.; "Expander Codes"; IEEE 1994; pp. 566-576.

Wesel et al.; "Constellation Labeling for Linear Encoders"; IEEE Transactions on Information Theory; vol. 47, No. 6; Sep. 2001; pp. 2417-2431.

Vasic, B.; "Structured Iteratively Decodable Codes Based on Steiner Systems and Their Application in Magnetic Recording"; Global Telecommunications Conference; vol. 5; Nov. 2001; pp. 2954-2960.

Vasic, B.; "Combinatorial Constructions of Low-Density Parity Check Codes for Iterative Decoding"; Proceedings, IEEE International Symposium on Information Theory; 2002; p. 312; Jun. 30-Jul. 5, 2002.

Vasic, B.; Kirkman Systems and Their Application in Perpendicular Magnetic Recording; IEEE Transactions on Magnetics; vol. 38, No. 4; pp. 1705-1710; Jul. 2002.

Sci-Worx GMBH; "FEC-52 Next Generation FEC for Digital Video Broadcasting via Satellite"; www.sci-worx.com; 2003.

Goff; "Signal Constellations for Bit-Interleaved Coded Modulation"; IEEE Transactions on Information Theory; vol. 49, No. 1; Jan. 2003; pp. 307-313.

Ping, L. et al.; "Low Density Parity Check Codes with Semi-Random Parity Check Matrix"; Electronics Letters; IEEE Stevenage; vol. 35, No. 1; pp. 38-39; Jan. 7, 1999.

Johnson, S. et al.; "Construction of Low-Density Parity-Check Codes from Kirkman Triple Systems"; Proceedings, IEEE Global Telecommunications Conference 2001; pp. 970-974; Nov. 25-29, 2001.

Notice of Allowance dated May 5, 2008 in U.S. Appl. No. 11/635,998, filed Dec. 8, 2006 by Mustafa Eroz et al.

Non-final Office Action dated Nov. 13, 2007 in U.S. Appl. No. 11/635,998, filed Dec. 8, 2006 by Mustafa Eroz et al.

Notice of Allowance dated Oct. 17, 2007 in U.S. Appl. No. 11/059,938, filed Feb. 17, 2005 by Mustafa Eroz et al.

Non-final Office Action dated Nov. 27, 2007 in U.S. Appl. No. 10/961,124, filed Oct. 8, 2004 by Mustafa Eroz et al.

Korean Office Action dated Apr. 29, 2005 in Korean counterpart Application No. 10-2003-39765 corresponding to U.S. Appl. No. 10/353,230, filed Jan. 28, 2003 by Mustafa Eroz et al.

Japanese Office Action dated Jul. 4, 2005 in Japanese counterpart Application No. 2003-176330 corresponding to U.S. Appl. No. 10/353,230, filed Jan. 28, 2003 by Mustafa Eroz et al.

Japanese Decision of Rejection dated Jun. 13, 2006 in Japanese counterpart Application No. 2003-176330 corresponding to U.S. Appl. No. 10/353,230, filed Jan. 28, 2003 by Mustafa Eroz et al.

Japanese Pre-Appeal Examination report dated Dec. 25, 2006 in Japanese counterpart Application No. 2003-176330 corresponding to U.S. Appl. No. 10/353,230, filed Jan. 28, 2003 by Mustafa Eroz et al.

Chinese Office Action dated Apr. 7, 2006 in Chinese counterpart Application No. 03132883.0 corresponding to U.S. Appl. No. 10/353,230, filed Jan. 28, 2003 by Mustafa Eroz et al.

EPO Communication dated Apr. 20, 2004 in European counterpart Application No. 03254308.4 corresponding to U.S. Appl. No. 10/353,230, filed Jan. 28, 2003 by Mustafa Eroz et al.

EPO Communication dated May 12, 2005 in European counterpart Application No. 03254308.4 corresponding to U.S. Appl. No. 10/353,230, filed Jan. 28, 2003 by Mustafa Eroz et al.

EPO Summons to Attend Oral Proceedings dated Apr. 12, 2006 in European counterpart Application No. 03254308.4 corresponding to U.S. Appl. No. 10/353,230, filed Jan. 28, 2003 by Mustafa Eroz et al.
EPO Communication/Notice of Allowance dated Oct. 26, 2006 in European counterpart Application No. 03254308.4 corresponding to U.S. Appl. No. 10/353,230, filed Jan. 28, 2003 by Mustafa Eroz et al.
Wadayama, Sho; "Low Density Parity Check Code and Decoding Method"; Tokyo, Japan; Jun. 5, 2002; Triceps Corporation; pp. 123-131; ISBN: 4-88657-222-7.
Eleftheriou, E.; "G.gen: LDPC Codes for G.dmt.bis and G.lite.bis"; Jan. 2001; http://stanford.edu/class/ee379b/class_reader/ibm3.pdf.
Meglicki; "Linear Codes"; Apr. 2005; http://beige.ucs.indiana.edu/M743/node119.html.
Flarion; "Flarion Improves Speed for Data Communications and Multimedia Applications with Enhanced Forward Error-Correction Codes"; press releases; Feb. 19, 2002; http://www.flarion.com/news/pr_2002/021902.asp.
Wadayama, Takashi; "A Coded Modulation Scheme Based on Low Density Parity Check Codes"; IEICE Transaction on Fundamentals; Oct. 2001; vol. E84-A; pp. 2523-2527.
Narayanaswami, R.; "Coded Modulation with Low Density Parity Check Codes"; Master thesis; Texas A&M University; Jun. 2001; XP2271230.
Eleftheriou, E. et al.; "Low-Density Parity-Check Codes for Digital Subscriber Lines"; Proceedings; IEEE International Conference on Communications; New York, NY, USA; vol. 1; Apr. 28-May 2, 2002; pp. 1752-1757.
Zhang, T. et al.; "Joint Code and Decoder Design for Implementation Oriented (3, k)-Regular LDPC Codes"; Proceedings; $35^{th}$ Asilomar Conference on Signals, Systems & Computers; pp. 1232-1236; Nov. 4-7, 2001.
Duman, T. M. et al.; "Performance Bounds for Turbo-Coded Modulation Systems"; IEEE Transactions on Communications; vol. 47, No. 4; Apr. 1999; pp. 511-521.
Boutillon, E. et al.; "Decoder-First Code Design"; Proceedings; International Symposium on Turbo Codes and Related Topics; pp. 459-462; Sep. 4-7, 2000.

Richardson, T. et al.; "Efficient Encoding of Low-Density Parity Check Codes"; IEEE Transactions on Information Theory; vol. 47, No. 2; pp. 638-656; Feb. 2001.
Hagenauer, J. et al.; "Iterative Decoding of 6-8 Binary Block and Convolutional Codes"; IEEE Transactions on Information Theory; vol. 42, No. 2; Mar. 1996; pp. 429-445.
Li, X. et al.; "Bit-Interleaved Coded Modulation with Iterative Decoding using Soft Feedback"; Electronics Letters, IEE; Stevenage, Great Britain; vol. 34, No. 10; May 14, 1998; pp. 942-943.
Brink, S. et al.; "Iterative Demapping of QPSK Modulation"; Electronics Letters, IEE; Stevenage, Great Britain; vol. 34, No. 15; Jul. 23, 1998; pp. 1495-1460.
Hagenauer, J. et al.; "Decoding and Equalization with Analog Non-Linear Networks"; European Transactions on Telecommunications; Eurel publication; Milano, Italy; vol. 10, No. 6; Nov. 1999; pp. 659-680.
Non-final Office action dated Aug. 16, 2010 in U.S. Appl. No. 12/195,512, filed Aug. 21, 2008 by Mustafa Eroz et al.
Notice of Allowance dated Aug. 24, 2010 in U.S. Appl. No. 10/961,124, filed Oct. 8, 2004 by Mustafa Eroz et al.
Notice of Allowance dated May 5, 2008 in U.S. Appl. No. 11/635,998, filed Dec. 8, 2006 by Mustafa Eroz et al.
Notice of Allowance dated Jan. 21, 2011 in U.S. Appl. No. 12/195,512, filed Aug. 21, 2008 by Mustafa Eroz et al.
Notice of Allowance dated Feb. 9, 2011 in U.S. Appl. No. 11/710,761, filed Feb. 26, 2007 by Mustafa Eroz et al.
Chinese Office action dated Jul. 22, 2011 in Chinese Patent Application No. 03800852.1 filed Jul. 3, 2003 by Mustafa Eroz et al.
Japanese Office action dated Apr. 19, 2011 in Japanese Patent Application No. 2007-525661 filed Aug. 3, 2005 by Mustafa Eroz et al.
Non-final Office action dated May 12, 2011 in U.S. Appl. No. 11/938,110, filed Nov. 9, 2007 by Mustafa Eroz et al.
Non-final Office action dated Apr. 25, 2011 in U.S. Appl. No. 12/967,894, filed Dec. 14, 2010 by Mustafa Eroz et al.
Non-final Office action dated May 16, 2011 in U.S. Appl. No. 12/498,968, filed Jul. 7, 2009 by Mustafa Eroz et al.
Rejection Decision dated Nov. 11, 2011 in Chinese Patent Application No. 03800852.1 filed Jul. 3, 2003 by Mustafa Eroz et al.

* cited by examiner

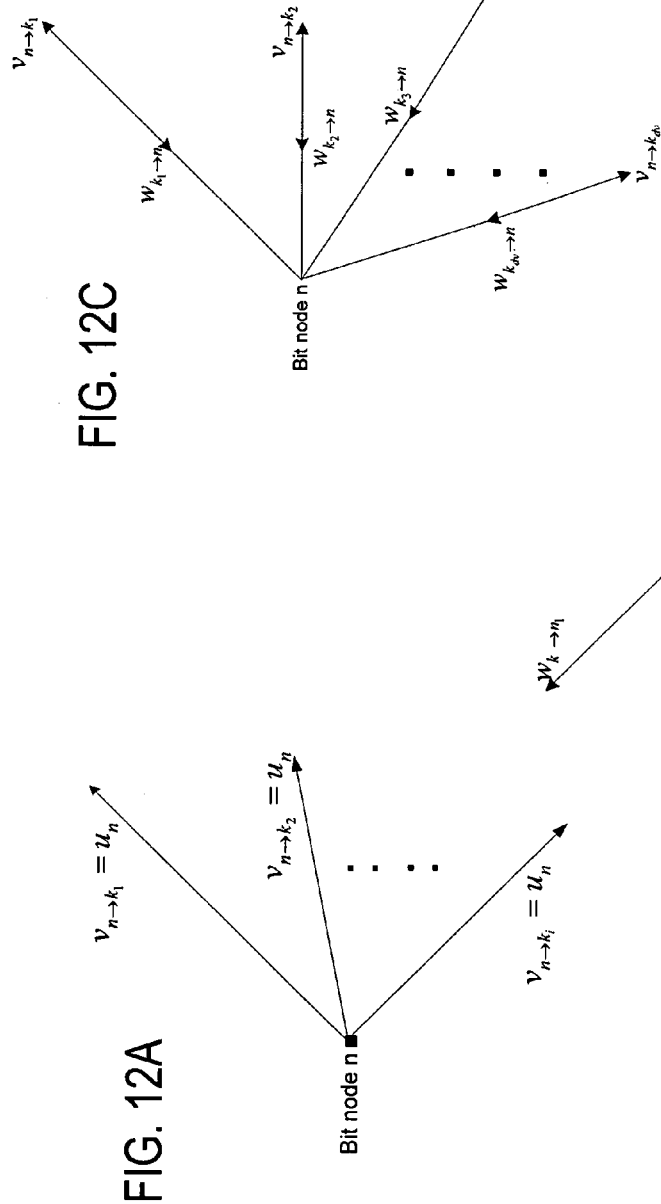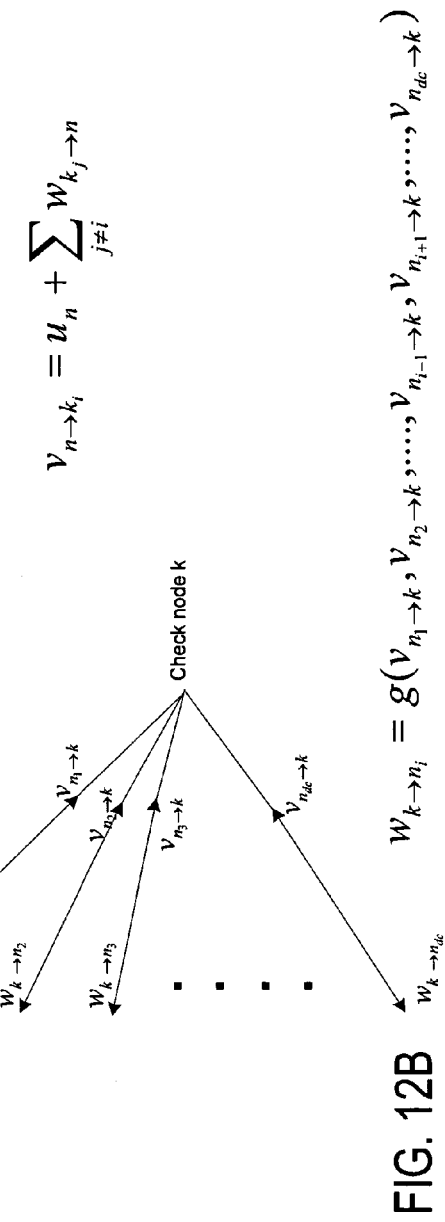
FIG. 12A
FIG. 12B
FIG. 12C

METHOD AND SYSTEM FOR GENERATING LOW DENSITY PARITY CHECK CODES

RELATED APPLICATIONS

This application is a divisional application of and claims priority to U.S. patent application (Ser. No. 10/353,230), filed Jan. 28, 2003, entitled "Method and System for Generating Low Density Parity Check Codes," which claims the benefit of the earlier filing date under 35 U.S.C. §119(e) of, U.S. Provisional Patent Application (Ser. No. 60/398,760), filed Jul. 26, 2002, entitled "Code Design and Implementation Improvements for Low Density Parity Check Codes," U.S. Provisional Patent Application (Ser. No. 60/403,812), filed Aug. 15, 2002, entitled "Power and Bandwidth Efficient Modulation and Coding Scheme for Direct Broadcast Satellite and Broadcast Satellite Communications," U.S. Provisional Patent Application (Ser. No. 60/421,505), filed Oct. 25, 2002, entitled "Method and System for Generating Low Density Parity Check Codes," U.S. Provisional Patent Application (Ser. No. 60/421,999), filed Oct. 29, 2002, entitled "Satellite Communication System Utilizing Low Density Parity Check Codes" and U.S. Provisional Patent Application (Ser. No. 60/423,710), filed Nov. 4, 2002, entitled "Code Design and Implementation Improvements for Low Density Parity Check Codes"; the entireties of which are incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic. From an implementation perspective, storage is an important reason why LDPC codes have not become widespread in practice. A key challenge in LDPC code implementation has been how to achieve the connection network between several processing engines (nodes) in the decoder.

Therefore, there is a need for a LDPC communication system that employs simple encoding and decoding processes. There is also a need for using LDPC codes efficiently to support high data rates, without introducing greater complexity. There is also a need to improve performance of LDPC encoders and decoders. There is a also need to minimize storage requirements for implementing LDPC coding. There is a further need for a scheme that simplifies the communication between processing nodes in the LDPC decoder.

SUMMARY OF THE INVENTION

These and other needs are addressed by the present invention, wherein an approach for generating a structured Low Density Parity Check (LDPC) codes is provided. Structure of the LDPC codes is provided by restricting portion part of the parity check matrix to be lower triangular and/or satisfying other requirements such that the communication between processing nodes of the decoder becomes very simple. Also, the approach can advantageously exploit the unequal error protecting capability of LDPC codes on transmitted bits to provide extra error protection to more vulnerable bits of high order modulation constellations (such as 8-PSK (Phase Shift Keying)). Additionally, the parity check matrix can be algorithmically generated using pre-stored constants and bitwise operations.

According to one aspect of an embodiment of the present invention, a method for generating low density parity check (LDPC) codes is provided. The method includes transforming a received input message into a LDPC codeword using only a parity check matrix of the LDPC codes without using a generator matrix of the LDPC codes, and outputting the LDPC codeword.

According to another aspect of an embodiment of the present invention, a method for supporting encoding of linear block codes is provided. The method includes mapping higher order signal constellation bits to bit nodes of a parity check matrix corresponding to the linear block codes. Vulnerable bits of the signal constellation are mapped to the bit nodes with at least three edges.

According to another aspect of an embodiment of the present invention, a method for supporting encoding of linear block codes is disclosed. The method includes mapping higher order signal constellation bits to bit nodes of a parity check matrix corresponding to the linear block code. The vulnerable bits of the signal constellation are mapped to the bit nodes with number of edges no less than that of more reliable bits.

According to another aspect of an embodiment of the present invention, a method for generating low density parity check (LDPC) codes is provided. The method includes transforming a received input message into a LDPC codeword using only a parity check matrix of the LDPC codes without using a generator matrix of the LDPC codes. The method also includes applying an outer code to the LDPC codeword, and outputting the LDPC codeword with the applied outer code.

According to another aspect of an embodiment of the present invention, a method for generating low density parity check (LDPC) code is disclosed. The method includes placing contents of edges for a group of bit nodes next to one another in memory. The method also includes simultaneously placing contents of edges for a group of check nodes next to one another in the memory.

According to another aspect of an embodiment of the present invention, a system for generating low density parity check (LDPC) codes is disclosed. The system includes means for transforming a received input message into a LDPC codeword using only a parity check matrix of the LDPC codes without using a generator matrix of the LDPC codes. The system also includes means for outputting the LDPC codeword.

According to yet another aspect of an embodiment of the present invention, a method for processing low density parity check (LDPC) codes is disclosed. The method includes decoding via a LDPC decoder received LDPC codes. The method also includes iteratively regenerating signal constellation bit metrics into the LDPC decoder after every or several LDPC decoder iterations.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 8A and 8B are, respectively, a diagram of a non-Gray 8-PSK modulation scheme, and a Gray 8-PSK modulation, each of which can be used in the system of FIG. 1;

FIGS. 12A-12C are diagrams of the interactions between the check nodes and the bit nodes in a decoding process, according to an embodiment of the present invention;

DESCRIPTION OF THE PREFERRED EMBODIMENT

A system, method, and software for efficiently generating structured Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
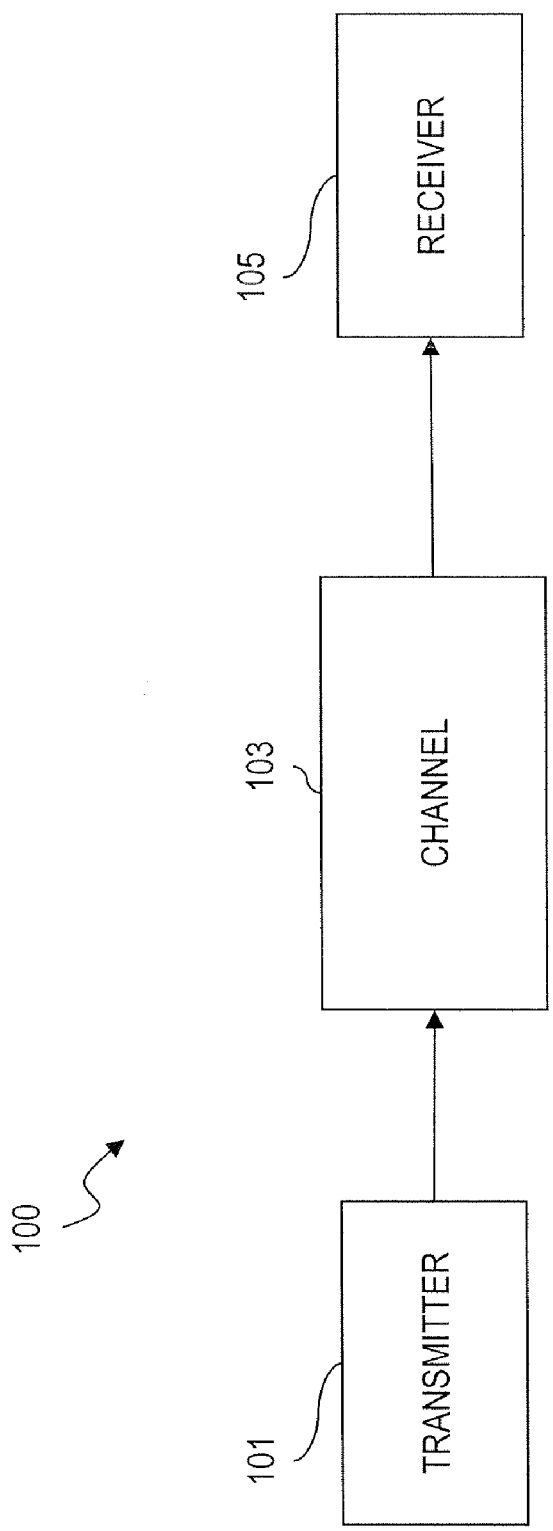
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

The LDPC codes that are generated by the transmitter 101 enables high speed implementation without incurring any performance loss. These structured LDPC codes output from the transmitter 101 avoid assignment of a small number of check nodes to the bit nodes already vulnerable to channel errors by virtue of the modulation scheme (e.g., 8-PSK).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 2:
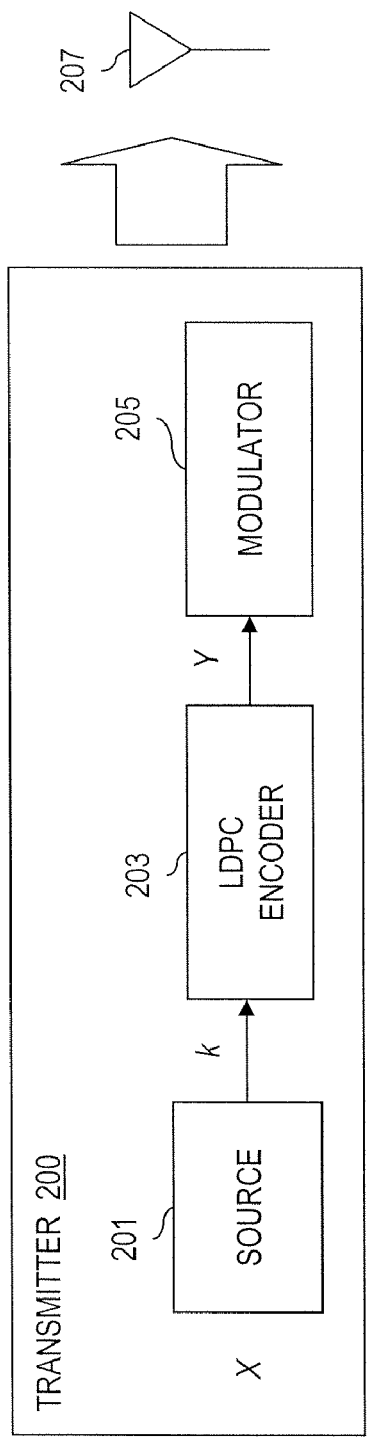
FIG. 2 is a diagram of an exemplary transmitter in the system of FIG. 1.

FIG. 2 is a diagram of an exemplary transmitter in the system of FIG. 1. A transmitter 200 is equipped with an LDPC encoder 203 that accepts input from an information source 201 and outputs coded stream of higher redundancy suitable for error correction processing at the receiver 105. The information source 201 generates k signals from a discrete alphabet, X. LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

Encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described more fully below in FIG. 6. Such a restriction results in negligible performance loss, and therefore, constitutes an attractive trade-off.

Modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver, as discussed below.

Figure 3:
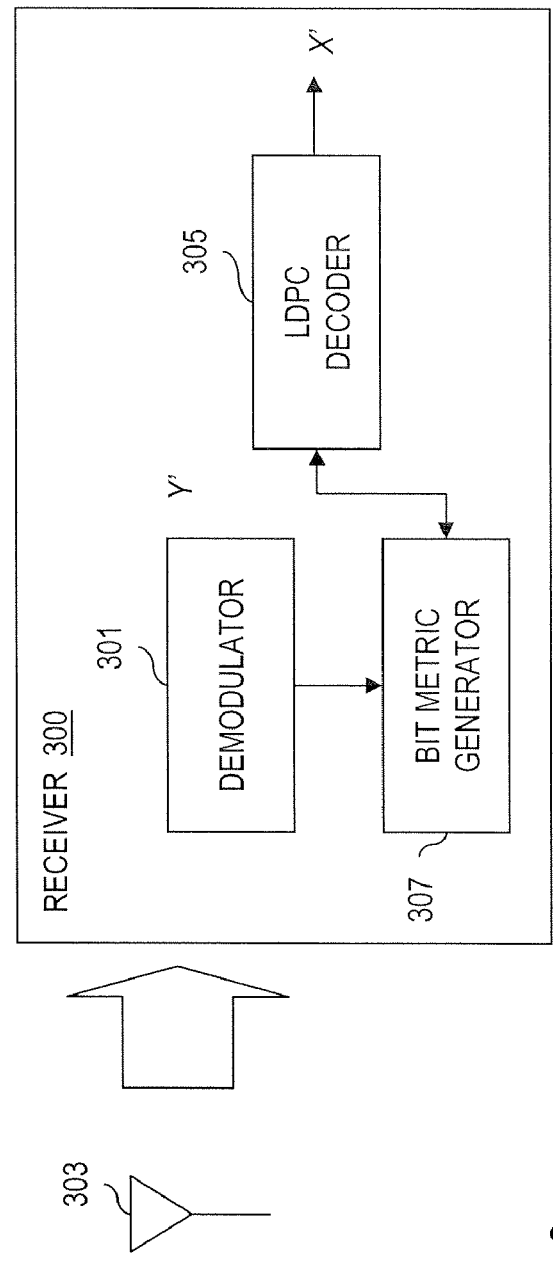
FIG. 3 is a diagram of an exemplary receiver in the system of FIG. 1.

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a decoder 305, which attempts to reconstruct the original source messages by generating messages, X' in conjunction with a bit metric generator 307. With non-Gray mapping, the bit metric generator 307 exchanges probability information with the decoder 305 back and forth (iteratively) during the decoding process, which is detailed in FIG. 10. Alternatively, if Gray mapping is used (according to one embodiment of the present invention), one pass of the bit metric generator is sufficient, in which further attempts of bit metric generation after each LDPC decoder iteration are likely to yield limited performance improvement; this approach is more fully described with respect to FIG. 11. To appreciate the advantages offered by the present invention, it is instructive to examine how LDPC codes are generated, as discussed in FIG. 4.

Figures 4, 5, 6:
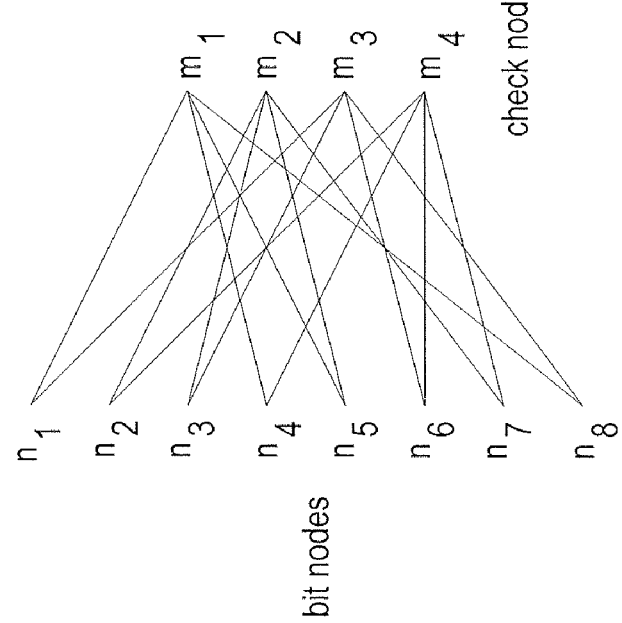
FIG. 4 is a diagram of a sparse parity check matrix, in accordance with an embodiment of the present invention.
FIG. 5 is a diagram of a bipartite graph of an LDPC code of the matrix of FIG. 4.
FIG. 6 is a diagram of a sub-matrix of a sparse parity check matrix, wherein the sub-matrix contains parity check values restricted to the lower triangular region, according to an embodiment of the present invention.

FIG. 4 is a diagram of a sparse parity check matrix, in accordance with an embodiment of the present invention. LDPC codes are long, linear block codes with sparse parity check matrix $H_{(n-k)\times n}$. Typically the block length, n, ranges from thousands to tens of thousands of bits. For example, a parity check matrix for an LDPC code of length n=8 and rate ½ is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning the receiver 303, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIG. 2) can employ a simple encoding technique by restricting the values of the lower triangular area of the parity check matrix. According to an embodiment of the present invention, the restriction imposed on the parity check matrix is of the form:

$$H_{(n-k)\times n} = [A_{(n-k)\times k} B_{(n-k)\times(n-k)}],$$

where B is lower triangular.

Any information block $i=(i_0, i_1, \ldots, i_{k-1})$ is encoded to a codeword $c=(i_0, i_1, \ldots, i_{k-1}, p_0, p_1, \ldots, p_{n-k-1})$ using $Hc^T=0$, and recursively solving for parity bits; for example, $$a_{00}i_0+a_{01}i_1+\ldots+a_{0,k-1}i_{k-1}+p_0=0 \Rightarrow \text{Solve } p_0,$$

$$a_{10}i_0+a_{11}i_1+\ldots+a_{1,k-1}i_{k-1}+b_{10}p_0+p_1=0 \Rightarrow \text{Solve } p_1$$

and similarly for $p_2, p_3, \ldots, p_{n-k-1}$.

Figure 7:
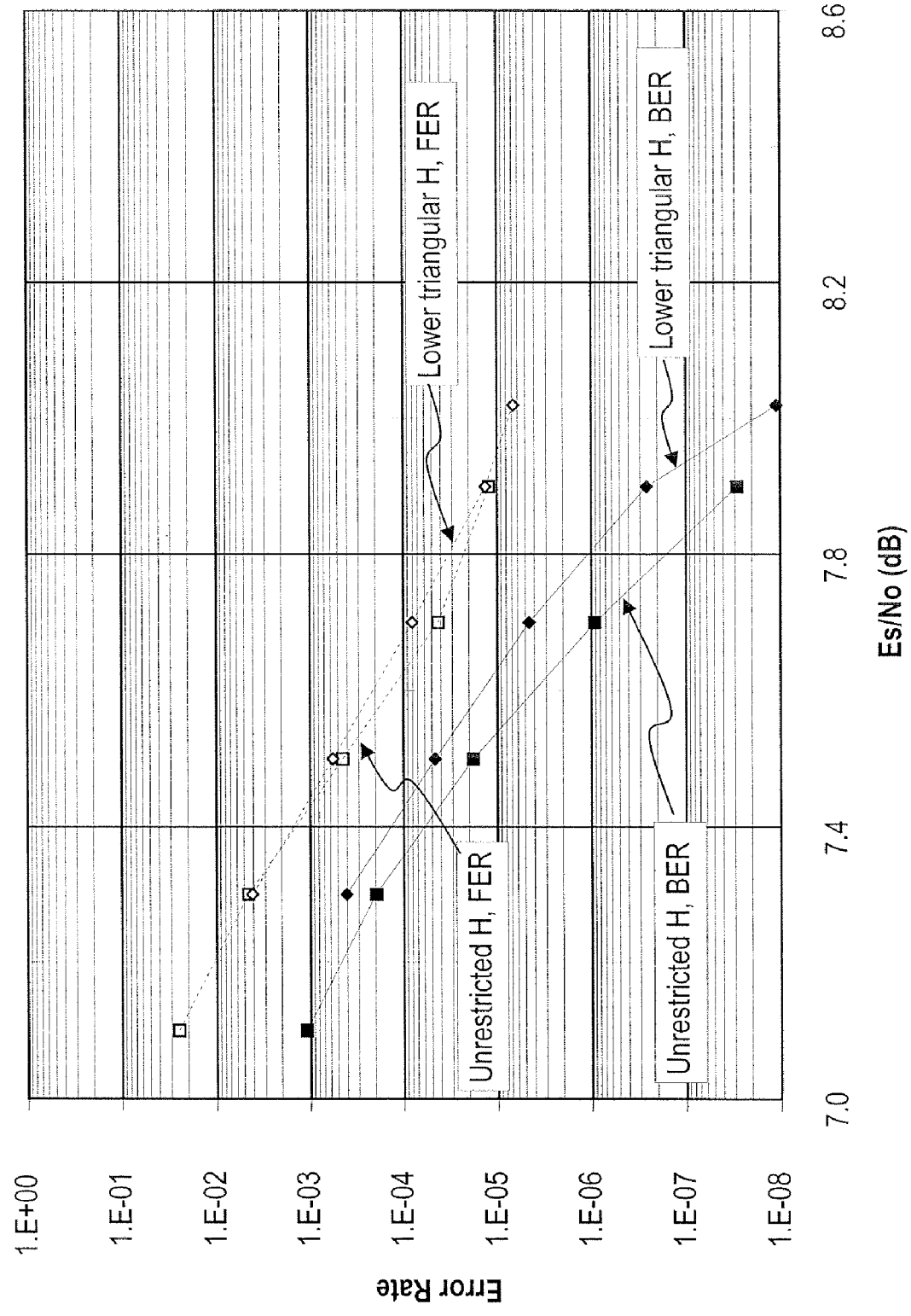
FIG. 7 is a graph showing performance between codes utilizing unrestricted parity check matrix (H matrix) versus restricted H matrix having a sub-matrix as in FIG. 6.

FIG. 7 is a graph showing performance between codes utilizing unrestricted parity check matrix (H matrix) versus restricted H matrix of FIG. 6. The graph shows the performance comparison between two LDPC codes: one with a general parity check matrix and the other with a parity check matrix restricted to be lower triangular to simplify encoding. The modulation scheme, for this simulation, is 8-PSK. The performance loss is within 0.1 dB. Therefore, the performance loss is negligible based on the restriction of the lower triangular H matrices, while the gain in simplicity of the encoding technique is significant. Accordingly, any parity check matrix that is equivalent to a lower triangular or upper triangular under row and/or column permutation can be utilized for the same purpose.

FIGS. 8A and 8B are, respectively, a diagram of a non-Gray 8-PSK modulation scheme, and a Gray 8-PSK modulation, each of which can be used in the system of FIG. 1. The non-Gray 8-PSK scheme of FIG. 8A can be utilized in the receiver of FIG. 3 to provide a system that requires very low Frame Erasure Rate (FER). This requirement can also be satisfied by using a Gray 8-PSK scheme, as shown in FIG. 8B, in conjunction with an outer code, such as Bose, Chaudhuri, and Hocquenghem (BCH), Hamming, or Reed-Solomon (RS) code.

Alternatively, the Gray 8-PSK scheme of FIG. 8B can be implemented with an outer code. Under this scheme, there is no need to iterate between the LDPC decoder 305 (FIG. 3) and the bit metric generator 307, which may employ 8-PSK modulation. In the absence of an outer code, the LDPC decoder 305 using Gray labeling exhibit an earlier error floor, as shown in FIG. 9 below.

Figure 9:
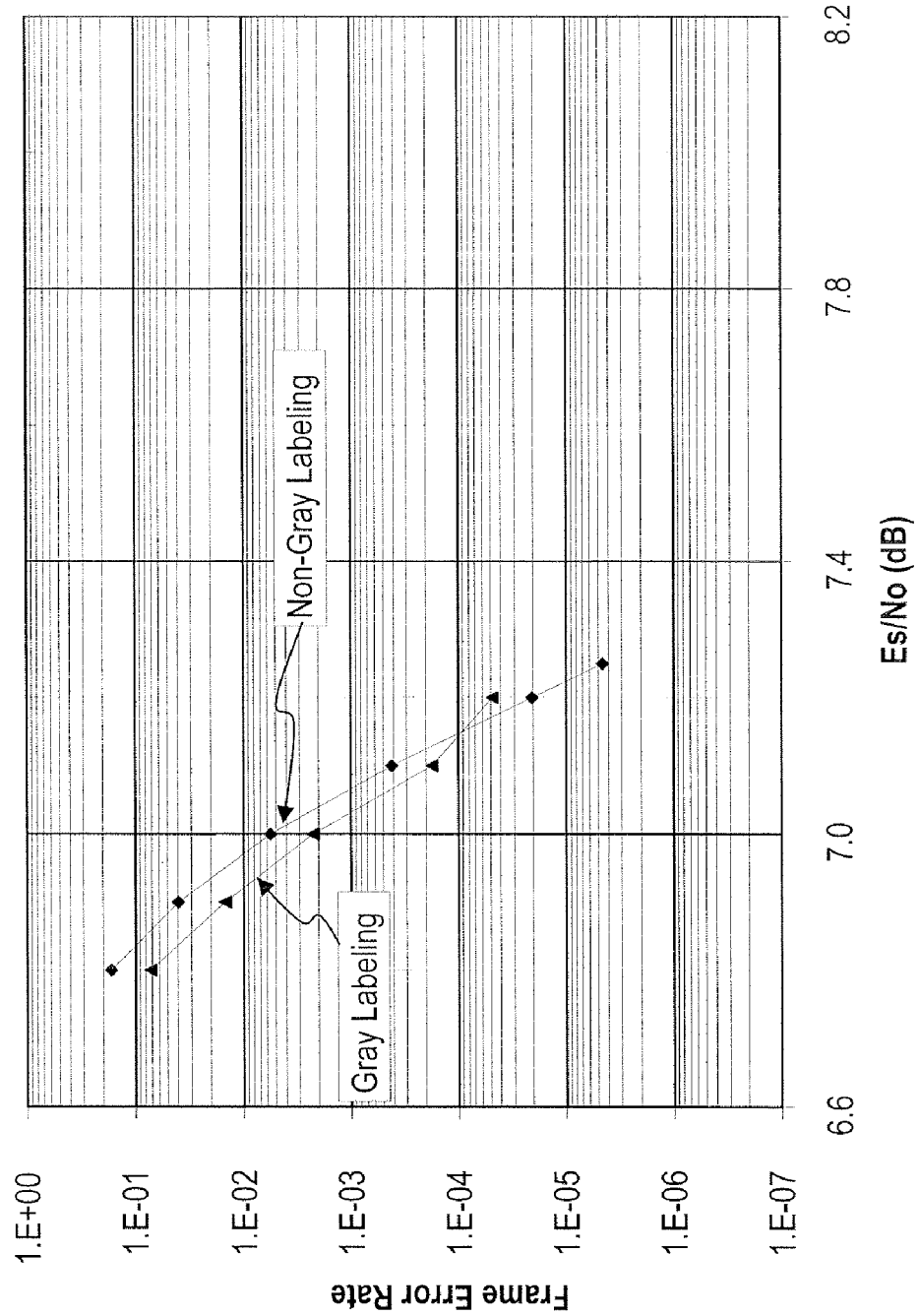
FIG. 9 is a graph showing performance between codes utilizing Gray labeling versus non-Gray labeling.

FIG. 9 is a graph showing performance between codes utilizing Gray labeling versus non-Gray labeling of FIGS. 8A and 8B. The error floor stems from the fact that assuming correct feedback from LDPC decoder 305, regeneration of 8-PSK bit metrics is more accurate with non-Gray labeling since the two 8-PSK symbols with known two bits are further apart with non-Gray labeling. This can be equivalently seen as operating at higher Signal-to-Noise Ratio (SNR). Therefore, even though error asymptotes of the same LDPC code using Gray or non-Gray labeling have the same slope (i.e., parallel to each other), the one with non-Gray labeling can pass through lower FER at certain SNRs.

On the other hand, for systems that do not require very low FER, Gray labeling without any iteration between LDPC decoder 305 and 8-PSK bit metric generator 307 may be more suitable because re-generating 8-PSK bit metrics before every LDPC decoder iteration causes additional complexity. Moreover, when Gray labeling is used, re-generating 8-PSK bit metrics before every LDPC decoder iteration yields only very slight performance improvement. As mentioned previously, Gray labeling without iteration may be used for systems that require very low FER, provided an outer code is implemented.

The choice between Gray labeling and non-Gray labeling depends also on the characteristics of the LDPC code. Typically, the higher bit or check node degrees, the better it is for Gray labeling, because for higher node degrees, the initial feedback from LDPC decoder 305 to 8-PSK (or similar higher order modulation) bit metric generator 307 deteriorates more with non-Gray labeling.

When 8-PSK (or similar higher order) modulation is utilized with a binary decoder, it is recognized that the three (or more) bits of a symbol are not received "equally noisy". For example with Gray 8-PSK labeling, the third bit of a symbol is considered more noisy to the decoder than the other two bits. Therefore, the LDPC code design does not assign a small number of edges to those bit nodes represented by "more noisy" third bits of 8-PSK symbol so that those bits are not penalized twice.

Figure 10:
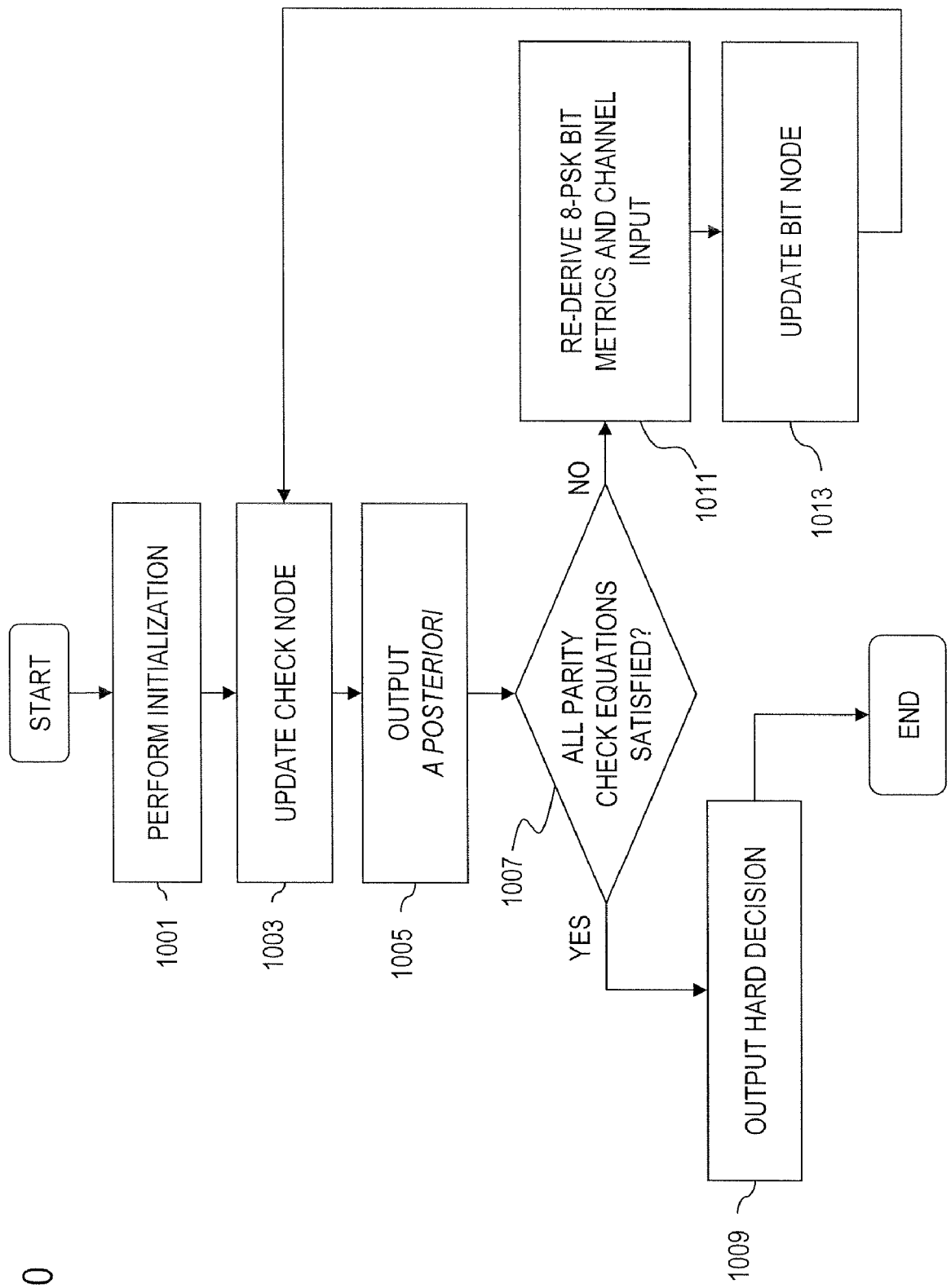
FIG. 10 is a flow chart of the operation of the LDPC decoder using non-Gray mapping, according to an embodiment of the present invention.

FIG. 10 is a flow chart of the operation of the LDPC decoder using non-Gray mapping, according to an embodiment of the present invention. Under this approach, the LDPC decoder and bit metric generator iterate one after the other. In this example, 8-PSK modulation is utilized; however, the same principles apply to other higher modulation schemes as well. Under this scenario, it is assumed that the demodulator 301 outputs a distance vector, d, denoting the distances between received noisy symbol points and 8-PSK symbol points to the bit metric generator 307, whereby the vector components are as follows:

$$d_i = -\frac{E_s}{N_0}\{(r_x - s_{i,x})^2 + (r_y - s_{i,y})^2\} \quad i = 0, 1, \ldots 7.$$

The 8-PSK bit metric generator 307 communicates with the LDPC decoder 305 to exchange a priori probability information and a posteriori probability information, which respectively are represented as u, and a. That is, the vectors u and a respectively represent a priori and a posteriori probabilities of log likelihood ratios of coded bits.

The 8-PSK bit metric generator 307 generates the a priori likelihood ratios for each group of three bits as follows. First, extrinsic information on coded bits is obtained:

$$e_j = a_j - u_j, j = 0, 1, 2.$$

Next, 8-PSK symbol probabilities, $p_i$ i=0, 1, ..., 7, are determined.

*$y_j = -f(0, e_j), j = 0, 1, 2$ where $f(a,b) = \max(a,b) + \text{LUT}_f(a,b)$ with $\text{LUT}_f(a,b) = \ln(1+e^{-|a-b|})$

*$x_j = y_j + e_j, j = 0, 1, 2$

*$p_0 = x_0 + x_1 + x_2$  $p_4 = y_0 + x_1 + x_2$ $p_1 = x_0 + x_1 + y_2$  $p_5 = y_0 + x_1 + y_2$ $p_2 = x_0 + y_1 + x_2$  $p_6 = y_0 + y_1 + x_2$ $p_3 = x_0 + y_1 + y_2$  $p_7 = y_0 + y_1 + y_2$

Next, the bit metric generator 307 determines a priori log likelihood ratios of the coded bits as input to LDPC decoder 305, as follows:

$$u_0 = f(d_0+p_0, d_1+p_1, d_2+p_2, d_3+p_3) - f(d_4+p_4, d_5+p_5, d_6+p_6, d_7+p_7) - e_0$$

$$u_1 = f(d_0+p_0, d_1+p_1, d_4+p_4, d_5+p_5) - f(d_2+p_2, d_3+p_3, d_6+p_6, d_7+p_7) - e_1$$

$$u_2 = f(d_0+p_0, d_2+p_2, d_4+p_4, d_6+p_6) - f(d_1+p_1, d_3+p_3, d_5+p_5, d_7+p_7) - e_2$$

It is noted that the function f(.) with more than two variables can be evaluated recursively; e.g. f(a,b,c)=f(f(a,b),c).

The operation of the LDPC decoder 305 utilizing non-Gray mapping is now described. In step 1001, the LDPC decoder 305 initializes log likelihood ratios of coded bits, v, before the first iteration according to the following (and as shown in FIG. 12A):

$$v_{n \to k_i} = u_n, n=0, 1, \ldots, N-1, i=1, 2, \ldots, \deg(\text{bit node } n)$$

Here, $v_{n \to k_i}$ denotes the message that goes from bit node n to its adjacent check node $k_i$, $u_n$ denotes the demodulator output for the bit n and N is the codeword size.

In step 1003, a check node, k, is updated, whereby the input v yields the output w. As seen in FIG. 12B, the incoming messages to the check node k from its $d_c$ adjacent bit nodes are denoted by $v_{n_1 \to k}, v_{n_2 \to k}, \ldots, v_{n_{d_c} \to k}$. The goal is to compute the outgoing messages from the check node k back to $d_c$ adjacent bit nodes. These messages are denoted by $w_{k \to n_1}, w_{k \to n_2}, \ldots, w_{k \to n_{d_c}}$, where $$w_{k \to n_i} = g(v_{n_1 \to k}, v_{n_2 \to k}, \ldots, v_{n_{i-1} \to k}, v_{n_{i+1} \to k}, \ldots, v_{n_{d_c} \to k}).$$

The function g( ) is defined as follows:

$$g(a,b) = \text{sign}(a) \times \text{sign}(b) \times \{\min(|a|,|b|)\} + \text{LUT}_g(a,b),$$

where $\text{LUT}_g(a,b) = \ln(1+e^{-|a+b|}) - \ln(1+e^{-|a-b|})$. Similar to function f, function g with more than two variables can be evaluated recursively.

Next, the decoder 305, per step 1205, outputs a posteriori probability information (FIG. 12C), such that:

$$a_n = u_n + \sum_j w_{k_j \to n}$$

Per step 1007, it is determined whether all the parity check equations are satisfied. If these parity check equations are not satisfied, then the decoder 305, as in step 1009, re-derives 8-PSK bit metrics and channel input $u_n$. Next, the bit node is updated, as in step 1011. As shown in FIG. 13C, the incoming messages to the bit node n from its $d_v$ adjacent check nodes are denoted by $w_{k_1 \to n}, w_{k_2 \to n}, \ldots, w_{k_{d_v} \to n}$. The outgoing messages from the bit node n are computed back to d, adjacent check nodes; such messages are denoted by $v_{n \to k_1}, v_{n \to k_2}, \ldots, v_{n \to k_{d_v}}$ and computed as follows:

$$v_{n \to k_i} = u_n + \sum_{j \neq i} w_{k_j \to n}$$

In step 1013, the decoder 305 outputs the hard decision (in the case that all parity check equations are satisfied):

$$\hat{c}_n = \begin{cases} 0, & a_n \geq 0 \\ 1, & a_n < 0 \end{cases} \text{ Stop if } H\hat{c}^T = 0$$

The above approach is appropriate when non-Gray labeling is utilized. However, when Gray labeling is implemented, the process of FIG. 11 is executed.

Figure 11:
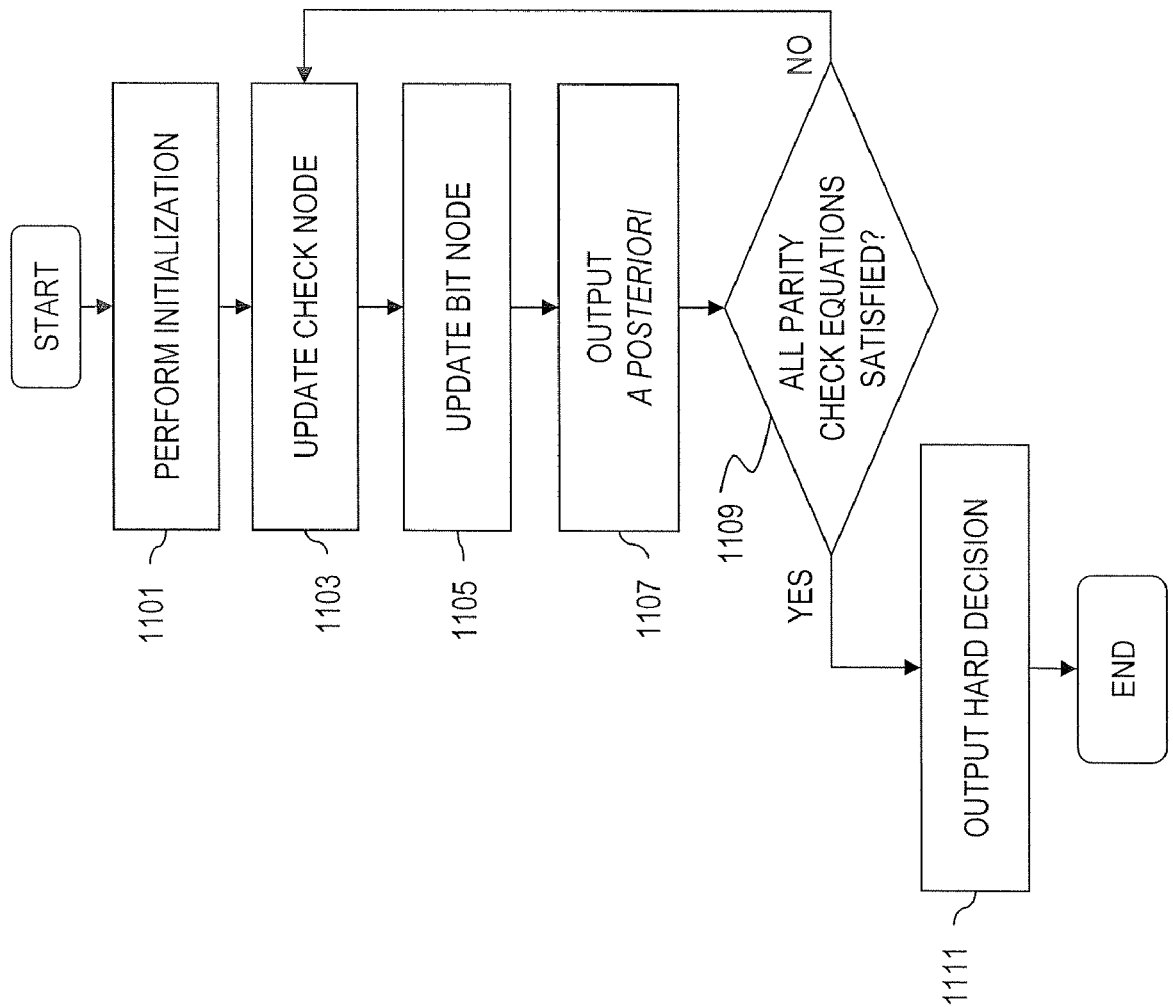
FIG. 11 is a flow chart of the operation of the LDPC decoder of FIG. 3 using Gray mapping, according to an embodiment of the present invention.

FIG. 11 is a flow chart of the operation of the LDPC decoder of FIG. 3 using Gray mapping, according to an embodiment of the present invention. When Gray labeling is used, bit metrics are advantageously generated only once before the LDPC decoder, as re-generating bit metrics after every LDPC decoder iteration may yield nominal performance improvement. As with steps 1001 and 1003 of FIG. 10, initialization of the log likelihood ratios of coded bits, v, are performed, and the check node is updated, per steps 1101 and 1103. Next, the bit node n is updated, as in step 1105. Thereafter, the decoder outputs the a posteriori probability information (step 1107). In step 1109, a determination is made whether all of the parity check equations are satisfied; if so, the decoder outputs the hard decision (step 1111). Otherwise, steps 1103-1107 are repeated.

Figure 13A:
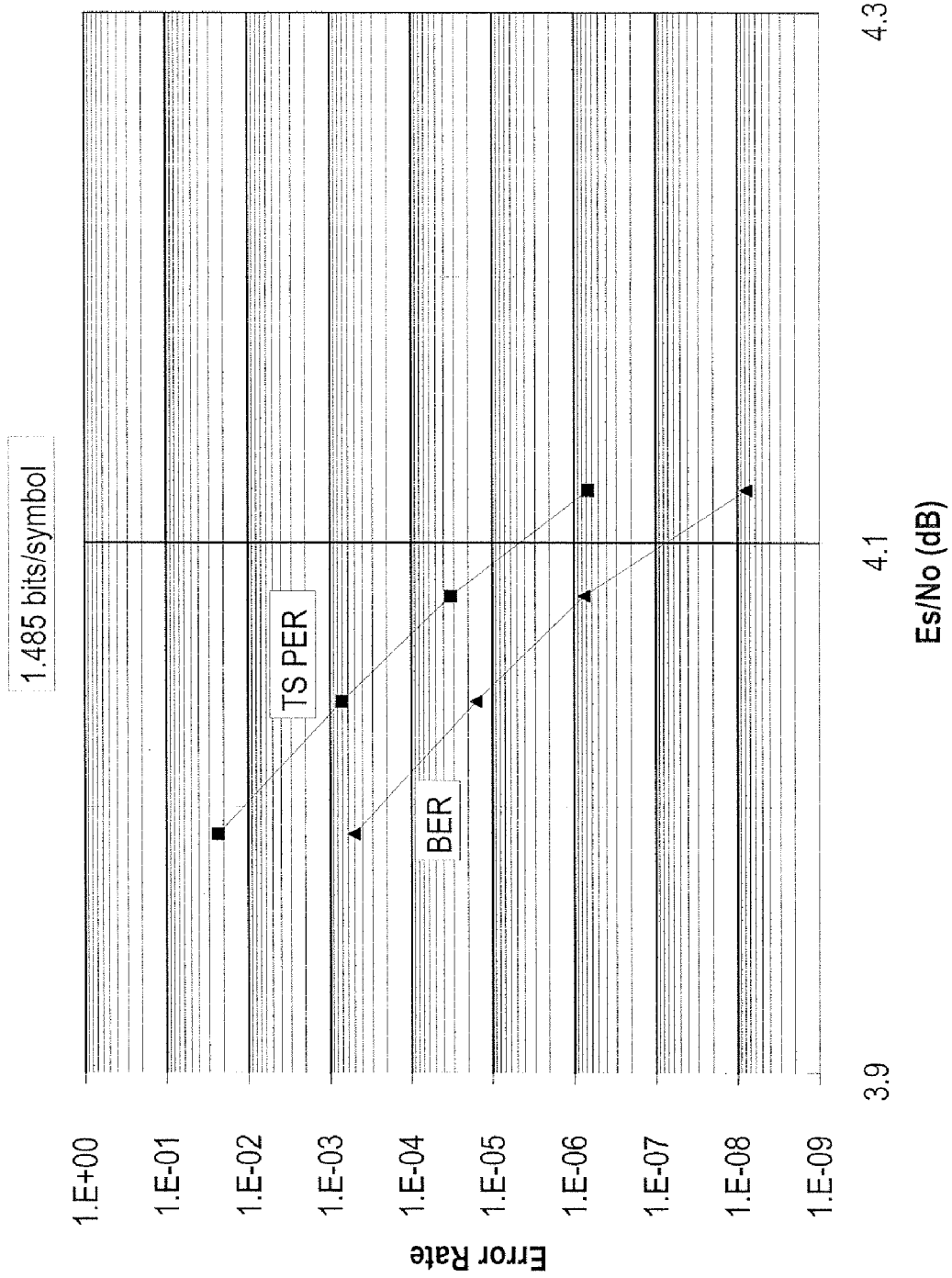
FIGS. 13A-13C are graphs showing simulation results of LDPC codes generated in accordance with various embodiments of the present invention.
Figure 13B:
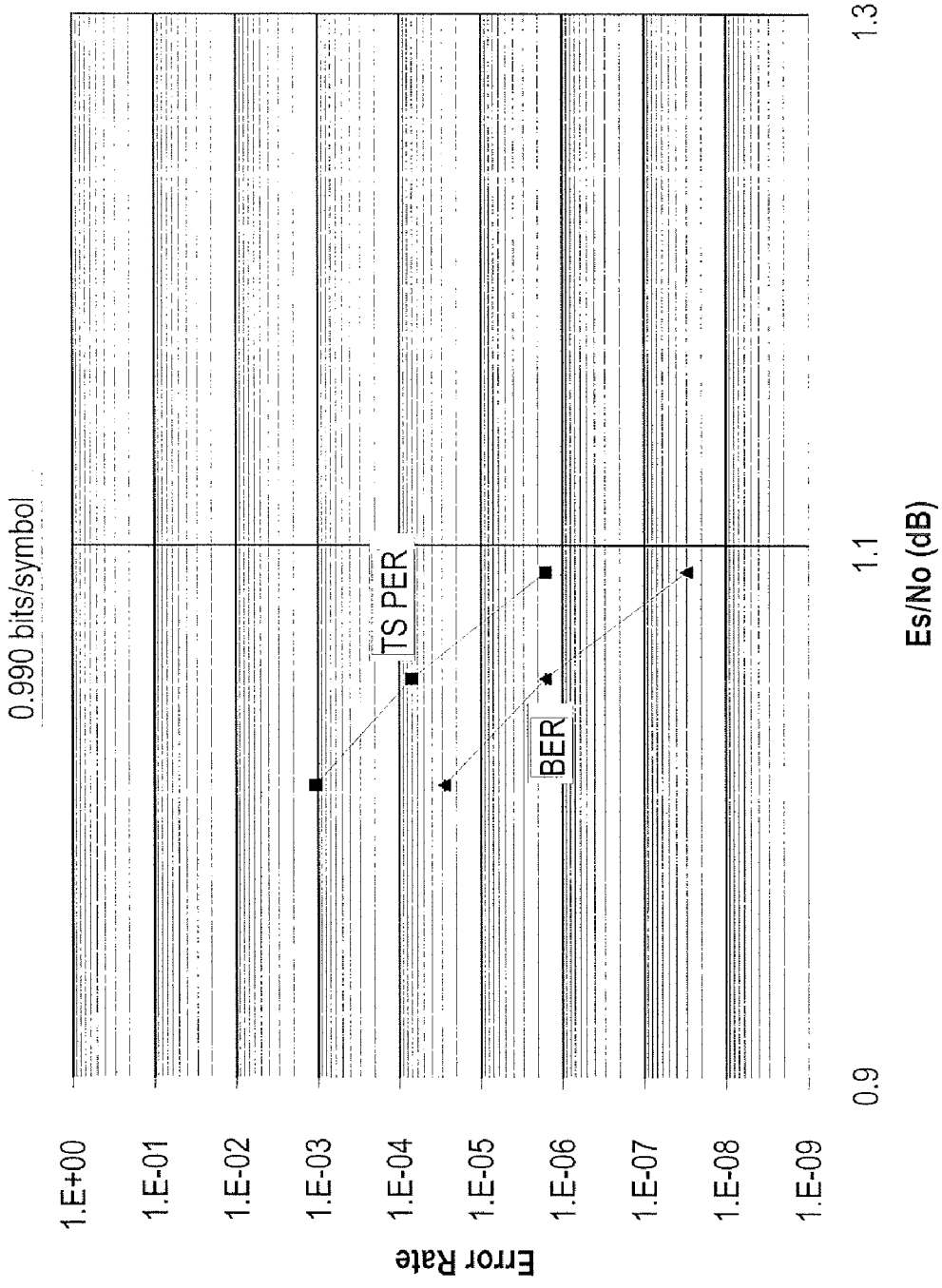
Figure 13C:
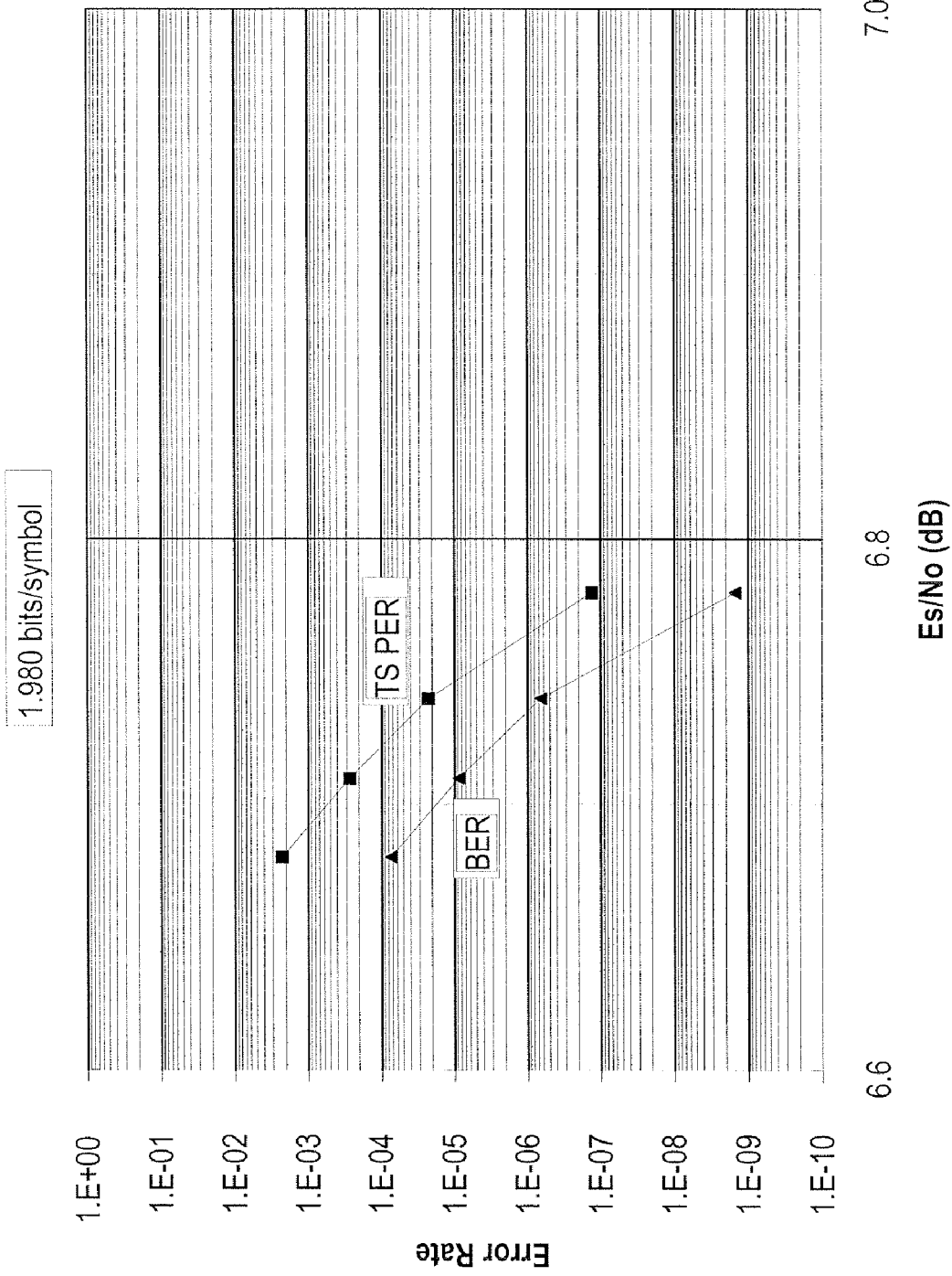

FIGS. 13A-13C are graphs showing simulation results of LDPC codes generated in accordance with various embodiments of the present invention. In particular, FIGS. 13A-13C show the performance of LDPC codes with higher order modulation and code rates of ¾ (QPSK, 1.485 bits/symbol), ⅔ (8-PSK, 1.980 bits/symbol), and ⅚ (8-PSK, 2.474 bits/symbol).

Two general approaches exist to realize the interconnections between check nodes and bit nodes: (1) a fully parallel approach, and (2) a partially parallel approach. In fully parallel architecture, all of the nodes and their interconnections are physically implemented. The advantage of this architecture is speed.

The fully parallel architecture, however, may involve greater complexity in realizing all of the nodes and their connections. Therefore with fully parallel architecture, a smaller block size may be required to reduce the complexity. In that case, for the same clock frequency, a proportional reduction in throughput and some degradation in FER versus Es/No performance may result.

The second approach to implementing LDPC codes is to physically realize only a subset of the total number of the nodes and use only these limited number of "physical" nodes to process all of the "functional" nodes of the code. Even though the LDPC decoder operations can be made extremely simple and can be performed in parallel, the further challenge in the design is how the communication is established between "randomly" distributed bit nodes and check nodes. The decoder 305, of FIG. 3, according to one embodiment of the present invention, addresses this problem by accessing memory in a structured way, as to realize a seemingly random code. This approach is explained with respect to FIGS. 14A and 14B.

Figure 14A:
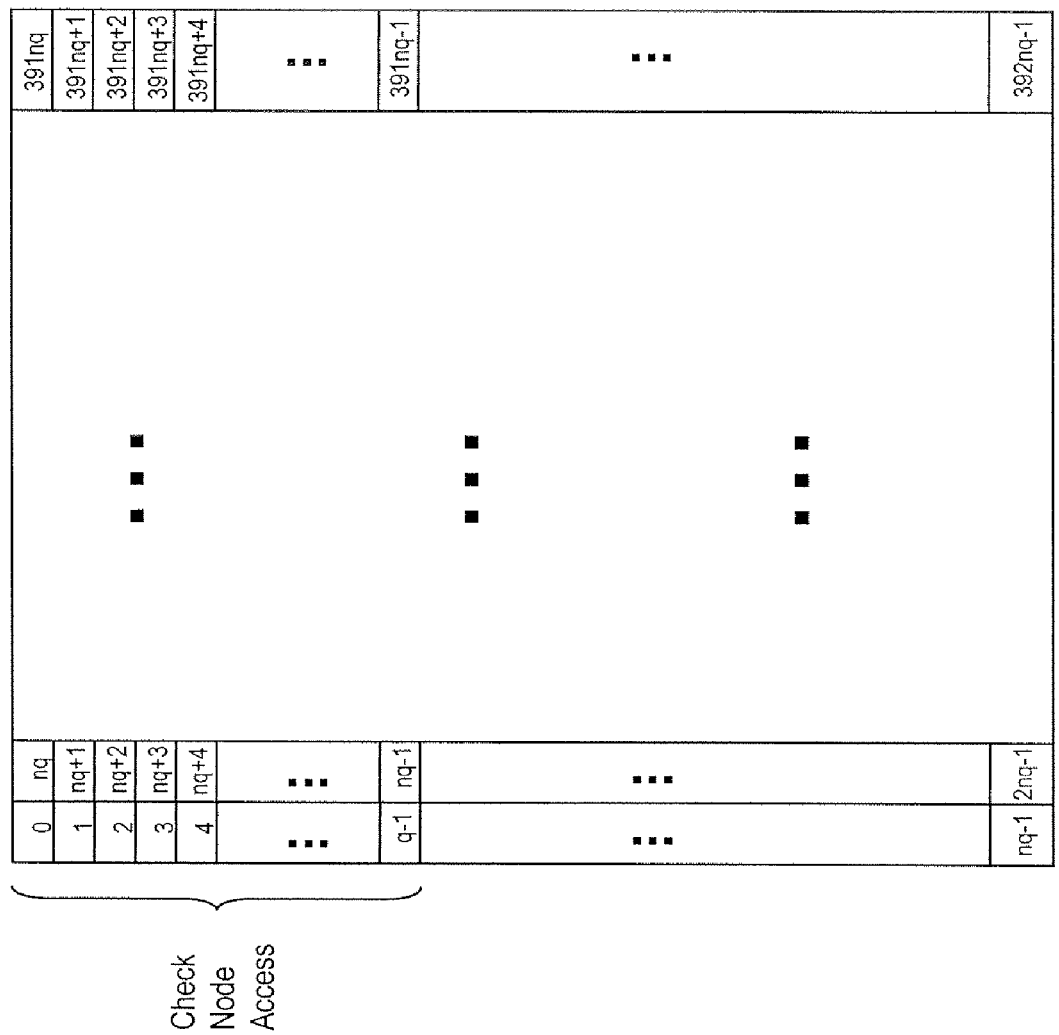
FIGS. 14A and 14B are diagrams of the top edge and bottom edge, respectively, of memory organized to support structured access as to realize randomness in LDPC coding, according to an embodiment of the present invention.
Figure 14B:
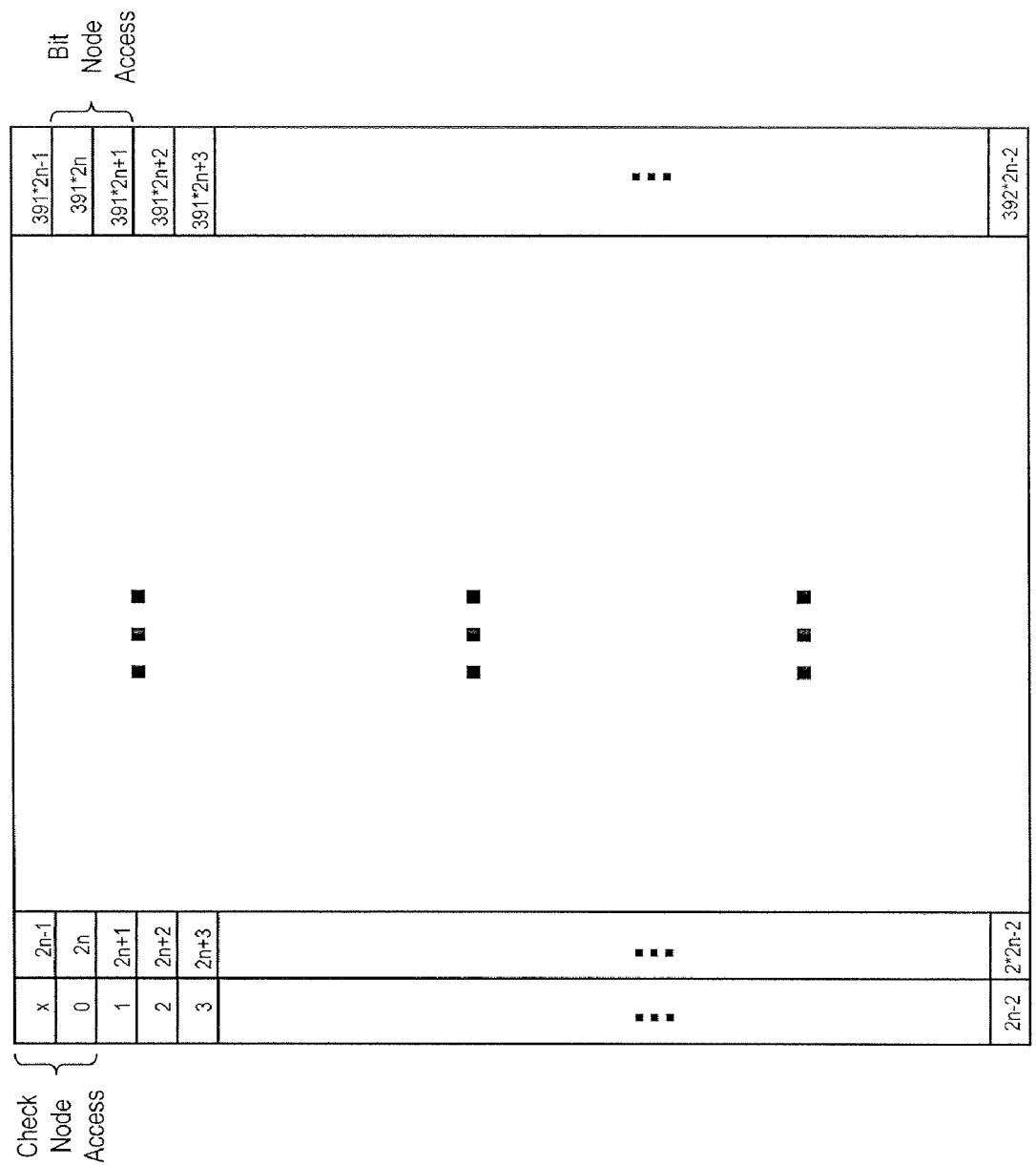

FIGS. 14A and 14B are diagrams of the top edge and bottom edge, respectively, of memory organized to support structured access as to realize randomness in LDPC coding, according to an embodiment of the present invention. Structured access can be achieved without compromising the performance of a truly random code by focusing on the generation of the parity check matrix. In general, a parity check matrix can be specified by the connections of the check nodes with the bit nodes. For example, the bit nodes are divided into groups of 392 (392 is provided for the purposes of illustration). Additionally, assuming the check nodes connected to the first bit node of degree 3, for instance, are numbered as a, b and c, then the check nodes connected to the second bit node are numbered as a+p, b+p and c+p, the check nodes connected to the third bit node are numbered as a+2p, b+2p and c+2p etc. For the next group of 392 bit nodes, the check nodes connected to the first bit node are different from a, b, c so that with a suitable choice of p, all the check nodes have the same degree. A random search is performed over the free constants such that the resulting LDPC code is cycle-4 and cycle-6 free.

The above arrangement facilitates memory access during check node and bit node processing. The values of the edges in the bipartite graph can be stored in a storage medium, such as random access memory (RAM). It is noted that for a truly random LDPC code during check node and bit node processing, the values of the edges would need to be accessed one by one in a random fashion. However, such an access scheme would be too slow for a high data rate application. The RAM of FIGS. 14A and 14B are organized in a manner, whereby a large group of relevant edges in one clock cycle; accordingly, these values are placed "together" in memory. It is observed that, in actuality, even with a truly random code, for a group of check nodes (and respectively bit nodes), the relevant edges can be placed next to one another in RAM, but then the relevant edges adjacent to a group of bit nodes (respectively check nodes) will be randomly scattered in RAM. Therefore, the "togetherness," under the present invention, stems from the design of the parity check matrices themselves. That is, the check matrix design ensures that the relevant edges for a group of bit nodes and check nodes are simultaneously placed together in RAM.

As seen in FIGS. 14A and 14B, each box contains the value of an edge, which is multiple bits (e.g., 6). Edge RAM, according to one embodiment of the present invention, is divided into two parts: top edge RAM (FIG. 14A) and bottom edge RAM (FIG. 14B). Bottom edge RAM contains the edges between bit nodes of degree 2, for example, and check nodes. Top edge RAM contains the edges between bit nodes of degree greater than 2 and check nodes. Therefore, for every check node, 2 adjacent edges are stored in the bottom RAM, and the rest of the edges are stored in the top edge RAM.

Continuing with the above example, a group of 392 bit nodes and 392 check nodes are selected for processing at a time. For 392 check node processing, q consecutive rows are accessed from the top edge RAM, and 2 consecutive rows from the bottom edge RAM. In this instance, q+2 is the degree of each check node. For bit node processing, if the group of 392 bit nodes has degree 2, their edges are located in 2 consecutive rows of the bottom edge RAM. If the bit nodes have degree d>2, their edges are located in some d rows of the top edge RAM. The address of these d rows can be stored in non-volatile memory, such as Read-Only Memory (ROM). The edges in one of the rows correspond to the first edges of 392 bit nodes, the edges in another row correspond to the second edges of 392 bit nodes, etc. Moreover for each row, the column index of the edge that belongs to the first bit node in the group of 392 can also be stored in ROM. The edges that correspond to the second, third, etc. bit nodes follow the starting column index in a "wrapped around" fashion. For example, if the $j^{th}$ edge in the row belongs to the first bit node, then the (j+1)st edge belongs to the second bit node, (j+2)nd edge belongs to the third bit node, . . . , and (j−1)st edge belongs to the $392^{th}$ bit node.

With the above organization (shown in FIGS. 14A and 14B), speed of memory access is greatly enhanced during LDPC coding.

Figure 15:
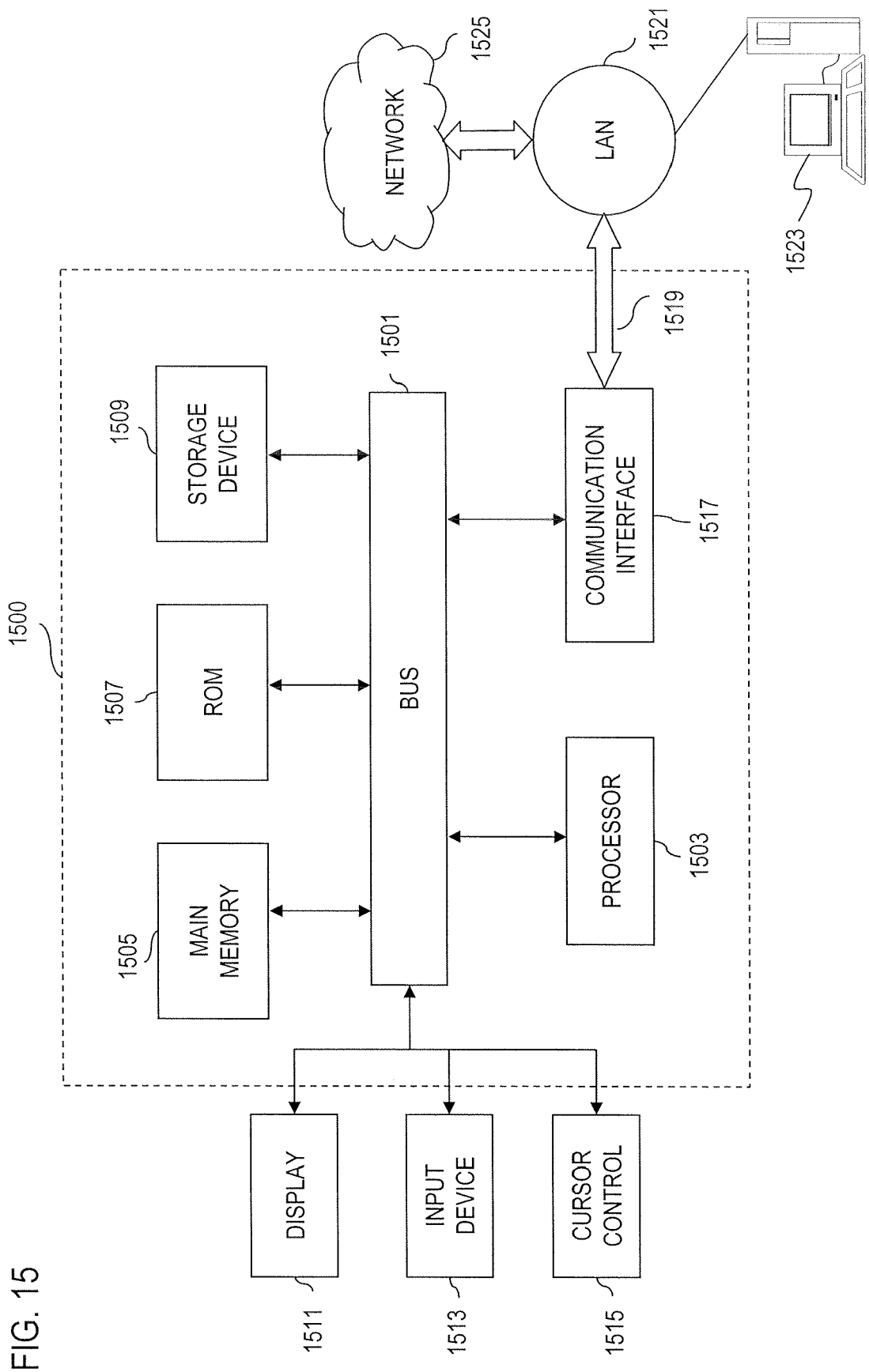
FIG. 15 is a diagram of a computer system that can perform the processes of encoding and decoding of LDPC codes, in accordance with embodiments of the present invention.

FIG. 15 illustrates a computer system 1500 upon which an embodiment according to the present invention can be implemented. The computer system 1500 includes a bus 1501 or other communication mechanism for communicating information, and a processor 1503 coupled to the bus 1501 for processing information. The computer system 1500 also includes main memory 1505, such as a random access memory (RAM) or other dynamic storage device, coupled to the bus 1501 for storing information and instructions to be executed by the processor 1503. Main memory 1505 can also be used for storing temporary variables or other intermediate information during execution of instructions to be executed by the processor 1503. The computer system 1500 further includes a read only memory (ROM) 1507 or other static storage device coupled to the bus 1501 for storing static information and instructions for the processor 1503. A storage device 1509, such as a magnetic disk or optical disk, is additionally coupled to the bus 1501 for storing information and instructions.

The computer system 1500 may be coupled via the bus 1501 to a display 1511, such as a cathode ray tube (CRT), liquid crystal display, active matrix display, or plasma display, for displaying information to a computer user. An input device 1513, such as a keyboard including alphanumeric and other keys, is coupled to the bus 1501 for communicating information and command selections to the processor 1503. Another type of user input device is cursor control 1515, such as a mouse, a trackball, or cursor direction keys for communicating direction information and command selections to the processor 1503 and for controlling cursor movement on the display 1511.

According to one embodiment of the invention, generation of LDPC codes is provided by the computer system 1500 in response to the processor 1503 executing an arrangement of instructions contained in main memory 1505. Such instructions can be read into main memory 1505 from another computer-readable medium, such as the storage device 1509. Execution of the arrangement of instructions contained in main memory 1505 causes the processor 1503 to perform the process steps described herein. One or more processors in a multi-processing arrangement may also be employed to execute the instructions contained in main memory 1505. In alternative embodiments, hard-wired circuitry may be used in place of or in combination with software instructions to implement the embodiment of the present invention. Thus, embodiments of the present invention are not limited to any specific combination of hardware circuitry and software.

The computer system 1500 also includes a communication interface 1517 coupled to bus 1501. The communication interface 1517 provides a two-way data communication coupling to a network link 1519 connected to a local network 1521. For example, the communication interface 1517 may be a digital subscriber line (DSL) card or modem, an integrated services digital network (ISDN) card, a cable modem, or a telephone modem to provide a data communication connection to a corresponding type of telephone line. As another example, communication interface 1517 may be a local area network (LAN) card (e.g. for Ethernet™ or an Asynchronous Transfer Mode (ATM) network) to provide a data communication connection to a compatible LAN. Wireless links can also be implemented. In any such implementation, communication interface 1517 sends and receives electrical, electromagnetic, or optical signals that carry digital data streams representing various types of information. Further, the communication interface 1517 can include peripheral interface devices, such as a Universal Serial Bus (USB) interface, a PCMCIA (Personal Computer Memory Card International Association) interface, etc.

The network link 1519 typically provides data communication through one or more networks to other data devices. For example, the network link 1519 may provide a connection through local network 1521 to a host computer 1523, which has connectivity to a network 1525 (e.g. a wide area network (WAN) or the global packet data communication network now commonly referred to as the "Internet") or to data equipment operated by service provider. The local network 1521 and network 1525 both use electrical, electromagnetic, or optical signals to convey information and instructions. The signals through the various networks and the signals on network link 1519 and through communication interface 1517, which communicate digital data with computer system 1500, are exemplary forms of carrier waves bearing the information and instructions.

The computer system 1500 can send messages and receive data, including program code, through the network(s), network link 1519, and communication interface 1517. In the Internet example, a server (not shown) might transmit requested code belonging to an application program for implementing an embodiment of the present invention through the network 1525, local network 1521 and communication interface 1517. The processor 1503 may execute the transmitted code while being received and/or store the code in storage device 159, or other non-volatile storage for later execution. In this manner, computer system 1500 may obtain application code in the form of a carrier wave.

The term "computer-readable medium" as used herein refers to any medium that participates in providing instructions to the processor 1503 for execution. Such a medium may take many forms, including but not limited to non-volatile media, volatile media, and transmission media. Non-volatile media include, for example, optical or magnetic disks, such as storage device 1509. Volatile media include dynamic memory, such as main memory 1505. Transmission media include coaxial cables, copper wire and fiber optics, including the wires that comprise bus 1501. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for generating structured Low Density Parity Check (LDPC) codes, as to simplify the encoder and decoder. Structure of the LDPC codes is provided by restricting the parity check matrix to be lower triangular. Also, the approach can advantageously exploit the unequal error protecting capability of LDPC codes on transmitted bits to provide extra error protection to more vulnerable bits of high order modulation constellations (such as 8-PSK (Phase Shift Keying)). Additionally, the parity check matrix can be algorithmically generated using pre-stored constants and bitwise operations. Efficient decoding of the LDPC can be achieved by storing information representing consecutive edges from the check nodes to the bit nodes of the parity check matrix in consecutive slots of memory. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method comprising:
encoding information bits according to a linear block code to generate encoded bits;
transforming the coded bits by mapping bits of a signal constellation having an order of at least four to bit nodes of a parity check matrix corresponding to a linear block code,
wherein bits of the signal constellation that are more vulnerable to channel errors are mapped to bit nodes of the parity check matrix with a number of edges no less than bit nodes mapped to bits of the signal constellation that are less vulnerable to channel errors;
modulating the transformed coded bits according to the signal constellation to generate a modulated signal; and
transmitting the modulated signal.

2. A method according to claim 1,
wherein the bits of the signal constellation that are more vulnerable to channel errors are mapped to bit nodes with at least three edges.

3. A method according to claim 2, wherein the signal constellation comprises at least one of 8-PSK (Phase Shift Keying) or QPSK (Quadrature Phase Shift Keying).

4. A receiver configured to receive a signal representing the linear block code in accordance with claim 2.

5. A method according to claim 1, wherein the signal constellation comprises at least one of 8-PSK (Phase Shift Keying) or QPSK (Quadrature Phase Shift Keying).

6. A receiver configured to receive a signal representing the linear block code in accordance with claim 1.

7. A transmitter configured to implement the method of claim 1.

* * * * *